US012813027B2

(12) United States Patent
Sun et al.

(10) Patent No.: US 12,813,027 B2
(45) Date of Patent: Nov. 24, 2026

(54) LED SUPPORT, LAMP BEAD AND MANUFACTURING METHOD THEREOF, CONDUCTIVE BASE, AND LIGHT-EMITTING UNIT MODULE

(71) Applicant: Shenzhen Jufei Optoelectronics Co., Ltd., Shenzhen (CN)

(72) Inventors: Pingru Sun, Shenzhen (CN); Qingqing Tan, Shenzhen (CN)

(73) Assignee: Shenzhen Jufei Optoelectronics Co., Ltd., Shenzhen (CN)

( * ) Notice: Subject to any disclaimer, the term of this patent is extended or adjusted under 35 U.S.C. 154(b) by 947 days.

(21) Appl. No.: 18/022,622

(22) PCT Filed: May 12, 2021

(86) PCT No.: PCT/CN2021/093271

§ 371 (c)(1),
(2) Date: Feb. 22, 2023

(87) PCT Pub. No.: WO2022/041846

PCT Pub. Date: Mar. 3, 2022

(65) Prior Publication Data

US 2023/0317889 A1 Oct. 5, 2023

(30) Foreign Application Priority Data

Aug. 31, 2020 (CN) ......................... 202010893729.1
Aug. 31, 2020 (CN) ......................... 202010894189.9

(Continued)

(51) Int. Cl.

*H10H 20/85* (2025.01)
*H10W 90/00* (2026.01)
*H10H 20/01* (2025.01)

(52) U.S. Cl.

CPC ........ *H10H 20/8506* (2025.01); *H10W 90/00* (2026.01); *H10H 20/0364* (2025.01)

(58) Field of Classification Search

CPC ............ H10H 20/8506; H10H 20/0364; F21V 19/0025

See application file for complete search history.

(56) References Cited

U.S. PATENT DOCUMENTS

2014/0264403 A1* 9/2014 Chu ...................... H10W 90/00 438/33
2015/0204525 A1* 7/2015 Shen ................... F21V 19/0025 362/231

(Continued)

FOREIGN PATENT DOCUMENTS

CN 204538081 U 8/2015
CN 112133815 A 12/2020

(Continued)

OTHER PUBLICATIONS

International Search Report (PCT/ISA/210) issued in PCT/CN2021/093271 mailed on Aug. 10, 2021.

*Primary Examiner* — Zheng Song
(74) *Attorney, Agent, or Firm* — Birch, Stewart, Kolasch & Birch, LLP

(57) ABSTRACT

Provided are an LED support, a lamp bead and a manufacturing method thereof, a conductive base, and a light-emitting unit module. An LED chip of the lamp bead can be directly disposed on a metal pad of the conductive base, and heat generated thereby can be directly dissipated outward through the metal pad. An exposed solder pad is provided at each of a lower surface and a first side surface of the metal pad for external electrical connection.

20 Claims, 11 Drawing Sheets

(30) Foreign Application Priority Data

| | | |
|---|---|---|
| Aug. 31, 2020 | (CN) | 202010894243.X |
| Aug. 31, 2020 | (CN) | 202021869713.9 |
| Aug. 31, 2020 | (CN) | 202021870053.6 |
| Aug. 31, 2020 | (CN) | 202021870262.0 |

(56) References Cited

U.S. PATENT DOCUMENTS

| | | | | |
|---|---|---|---|---|
| 2017/0324012 | A1 | 11/2017 | Wittmann et al. | |
| 2020/0287113 | A1* | 9/2020 | Gijsbers | F21V 29/70 |
| 2020/0292149 | A1* | 9/2020 | Shen | F21V 7/06 |
| 2021/0116749 | A1* | 4/2021 | Kao | G02F 1/133602 |
| 2021/0398865 | A1* | 12/2021 | Lin | H10P 74/273 |

FOREIGN PATENT DOCUMENTS

| | | | |
|---|---|---|---|
| CN | 112133816 | A | 12/2020 |
| CN | 112234135 | A | 1/2021 |
| CN | 212907791 | U | 4/2021 |
| CN | 212907792 | U | 4/2021 |
| DE | 10 2013 221 429 | A1 | 5/2015 |
| JP | 2015-177151 | A | 10/2015 |
| WO | 2016/071440 | A1 | 5/2016 |

* cited by examiner

LED SUPPORT, LAMP BEAD AND MANUFACTURING METHOD THEREOF, CONDUCTIVE BASE, AND LIGHT-EMITTING UNIT MODULE

BACKGROUND

Technical Field

The present invention relates to the field of light emitting diodes (LED), and in particular, to an LED support, a lamp bead and a manufacturing method thereof, a conductive base, and a light-emitting unit module.

Related Art

Currently, display devices require increasingly wide color gamuts and increasingly high brightness but increasingly small thicknesses. The color gamut is in negative correlation with the brightness. A wider color gamut requirement indicates a lower brightness. Since a brightness of a conventional package with a single chip cannot satisfy the requirements, an ultra-thin side emitting LED realizing a higher brightness at a wide color gamut needs to be proposed. To this end, the prior art provides an LED having a higher brightness at a wide color gamut. Referring to FIG. 1, the LED includes a plastic substrate 001, a circuit formed on a top surface of the plastic substrate 001 and electrically connected to an LED chip, and a solder pad 004 arranged on a bottom surface of the plastic substrate 001. The circuit on the top surface of the plastic substrate 001 is electrically connected to the solder pad 004 through a conductive material in a through hole extending the bottom surface. A housing 002 is formed on the plastic substrate 001. A cavity in which an LED chip 003 is placed is formed in the housing 002. The cavity is filled with a fluorescent glue 005. Although the LED with such a structure can improve the brightness, the structure is relatively complex and the costs are high. In addition, since two LED chips are arranged, an amount of heat generated during operation is twice that of a single LED chip. The heat generated by the LED chip in the LED is mainly dissipated by being transferred to the solder pad 004 through the conductive material in the through hole extending the plastic substrate 001. The heat dissipation path is long and the heat dissipation area is small, resulting in a poor heat dissipation effect.

SUMMARY

Technical Problems

The present invention provides an LED support, a lamp bead and a manufacturing method thereof, a conductive base, and a light-emitting unit module, to resolve problems about of an existing LED such as complex structure, high cost, and poor heat dissipation.

Solutions for the Technical Problems

In order to resolve the above technical problems, an embodiment of the present invention provides a conductive base of an LED support. The conductive base includes at least two metal pads insulated and isolated from each other. The metal pads are bonded to a colloid configured to form a support housing to form the LED support. Upper surfaces of the metal pads are located at a bottom of a bowl cup defined by the support housing. The bowl cup is configured for an LED chip to be placed. At least parts of the upper surfaces of the metal pads are exposed. The upper surface of at least one of the metal pads is configured to bear the LED chip. An exposed region of the upper surface of each of the metal pads is configured to be electrically connected to an electrode of a corresponding LED chip.

At least parts of lower surfaces of the metal pads are exposed from the support housing. The lower surfaces are surfaces opposite to the upper surfaces. A first side surface of at least one of the metal pads located between the upper surface and the lower surface is exposed from the support housing. A first notch is arranged in a region of the lower surface exposed from the support housing. A region of the first side surface exposed from the support housing is formed as a set soldering shape.

Based on the same concept, an embodiment of the present invention further provides an LED support. The LED support includes the conductive base described above and a colloid bonded to the conductive base to form the support housing.

Based on the same concept, an embodiment of the present invention further provides an LED lamp bead. The LED lamp bead includes the LED support described above, an LED chip arranged in the bowl cup, and a packaging layer arranged in the bowl cup and covering the LED chip. An electrode of the LED chip is electrically connected to the exposed region of the upper surface of the corresponding metal pad.

Based on the same concept, an embodiment of the present invention further provides a light-emitting unit module. The light-emitting unit module includes a substrate and a plurality of LED lamp beads described above. The LED lamp beads are electrically connected to the substrate.

Based on the same concept, an embodiment of the present invention further provides a manufacturing method of the LED support described above. The manufacturing method of the LED support includes:

- providing a conductive base assembly, wherein the conductive base assembly includes at least two conductive bases, one of the conductive bases correspondingly forms an LED support, and the other of the conductive bases includes at least two metal pads insulated and isolated from each other, and a cutting position is arranged between adjacent conductive bases;
- placing the conductive base assembly in a corresponding die, wherein a cavity region formed in the die is correspondingly a to-be-formed support housing region;
- filling the cavity region in the die with a colloid and forming a support housing after the colloid is cured; and
- removing the die and performing cutting along the cutting position to obtain a single LED support.

Based on the same concept, an embodiment of the present invention further provides a manufacturing method of the LED lamp bead described above. The manufacturing method of the LED lamp bead includes:

- providing a conductive base assembly, wherein the conductive base assembly includes at least two conductive bases, one of the conductive bases correspondingly forms an LED support, the other one of the conductive bases includes at least two metal pads insulated and isolated from each other, and a cutting position is arranged between adjacent conductive bases;
- placing the conductive base assembly in a corresponding die, and attaching to-be-exposed regions of the metal pads to the die snugly, wherein a cavity region formed in the die is correspondingly a to-be-formed support housing region;

filling the cavity region in the die with a colloid, and forming a support housing after the colloid is cured, wherein the support housing of a single LED support defines a bowl cup for placing an LED chip, upper surfaces of the metal pads of the single LED support are located at a bottom of the bowl cup and are at least partially exposed, and the upper surface of at least one of the metal pads is configured to bear the LED chip;

removing the die, arranging the LED chip in the bowl cup, and electrically connecting an electrode of the LED chip to a corresponding metal pad;

arranging, in the bowl cup, a packaging layer covering the LED chip; and performing cutting along the cutting position to obtain a single LED lamp bead;

or manufacturing the LED support through the manufacturing method of the LED support described above;

arranging the LED chip in the bowl cup, and electrically connecting an electrode of the LED chip to the corresponding metal pad; and arranging, in the bowl cup, a packaging layer covering the LED chip;

Beneficial Effects

The present invention provides an LED support, a lamp bead and a manufacturing method thereof, a conductive base, and a light-emitting unit module. The conductive base includes the at least two metal pads insulated and isolated from each other. The metal pads are bonded to a colloid configured to form a support housing to form the LED support. The upper surfaces of the metal pads are located at the bottom of a bowl cup defined by the support housing and configured for the LED chip to be placed and are at least partially exposed. The upper surface of at least one of the metal pads is configured to bear the LED chip. The exposed region of the upper surface of each of the metal pads is configured to be electrically connected to the electrode of a corresponding LED chip. At least parts of the lower surfaces of the metals pad are exposed from the support housing. In this way, heat generated by the LED chip during operation can be directly transferred to the metal pads and be quickly dissipated through the metal pads. The heat dissipation path is significantly shortened, and the heat dissipation area is significantly increased, thereby considerably improving the heat dissipation effect and ensuring the performance of the LED lamp bead.

In addition, the first side surface of at least one of the metal pads located between the upper surface and the lower surface is exposed from the support housing. A first notch configured to accommodate solder is arranged in a region of the lower surface exposed from the support housing. The region of the first side surface exposed from the support housing forms a set soldering shape. Since the lower surface and the first side surface of the metal pad are exposed, which may be used as solder pads used for external electrical connection, in a side emitting application scenario, the first side surface may be soldered to the outside, or both the first side surface and the lower surface may be soldered. In a front emitting application scenario, the lower surface may be soldered, or both the lower surface and the first side surface may be soldered. Therefore, various application scenarios are feasible, the soldering is convenient, and soldering may be performed on two surfaces as required, which can improve soldering firmness and improve product reliability.

In addition, since the first notch configured to accommodate the solder is arranged in the region of the lower surface of the metal pad exposed from the support housing, the configuration of the first notch can increase soldering area. A set soldering shape for increasing the soldering area is configured in the region of the first side surface exposed from the support housing, and the configuration of the first notch receives excessive solder during soldering as much as possible, thereby ensuring soldering flatness and reliability.

The LED support is composed of the conductive base and the support housing covering the conductive base, and the LED lamp bead is composed of the LED chip arranged in the bowl cup of the LED support and the packaging layer covering the LED chip. The structures of the LED support and the LED lamp bead are simpler, easier to manufacture, and less costly than the structures of an existing support and an existing lamp bead.

According to the LED support and the lamp bead and the manufacturing method thereof provided in the embodiments of the present invention, the manufacturing process is simple and quick, the efficiency of the LED support can be significantly improved, and die bonding and eutectic die bonding of the LED chip and the arrangement of the packaging layer may be completed before cutting or after a single LED support is obtained. Therefore, the production process of the LED lamp bead is also significantly simplified, which can in turn improve the production efficiency of the LED lamp bead and reduce the cost.

BRIEF DESCRIPTION OF THE DRAWINGS

FIG. 2-1 is a schematic diagram of a conductive base in an example provided by Embodiment I of the present invention;

FIG. 2-2 is a three-dimensional schematic diagram (I) of an LED support in an example provided by Embodiment I of the present invention;

FIG. 2-3 is a three-dimensional schematic diagram (II) of the LED support in the example provided by Embodiment I of the present invention;

FIG. 2-4 is a schematic diagram of another conductive base in an example provided by Embodiment I of the present invention;

FIG. 2-5 is a schematic diagram of a conductive base in another example provided by Embodiment I of the present invention;

FIG. 2-6 is a schematic diagram (I) of an LED support in another example provided by Embodiment I of the present invention;

FIG. 2-7 is a schematic diagram of a conductive base in yet another example provided by Embodiment I of the present invention;

FIG. 2-8 is a schematic diagram of an LED support in yet another example provided by Embodiment I of the present invention;

FIG. 2-9 is a schematic diagram of a conductive base in another example provided by Embodiment I of the present invention;

FIG. 2-10 is a schematic diagram of an LED support in another example provided by Embodiment I of the present invention;

FIG. 2-11 is a schematic diagram (I) of a conductive base in yet another example provided by Embodiment I of the present invention;

FIG. 2-12 is a schematic diagram (II) of the conductive base in yet another example provided by Embodiment I of the present invention;

FIG. 2-13 is a schematic diagram (III) of the conductive base in yet another example provided by Embodiment I of the present invention;

FIG. 3-1 is a schematic diagram of a conductive base in an example provided by embodiment II of the present invention;

FIG. 3-2 is a schematic diagram of an LED support in an example provided by Embodiment II of the present invention;

FIG. 3-3 is a schematic diagram of a conductive base in another example provided by Embodiment II of the present invention;

FIG. 3-4 is a schematic diagram of an LED support in another example provided by Embodiment II of the present invention;

FIG. 3-5 is a schematic diagram of a conductive base in yet another example provided by Embodiment II of the present invention;

FIG. 3-6 is a schematic diagram of an LED support in yet another example provided by Embodiment II of the present invention;

FIG. 3-7 is a projection diagram of the LED support in yet another example provided by Embodiment II of the present invention;

FIG. 3-8 is a schematic diagram of an LED support in another example provided by Embodiment II of the present invention;

FIG. 4-1 is a schematic diagram of a conductive base in an example provided by Embodiment III of the present invention;

FIG. 4-2 is a schematic diagram of an LED support in an example provided by Embodiment III of the present invention;

FIG. 4-3 is a schematic diagram of a conductive base in another example provided by Embodiment III of the present invention;

FIG. 4-4 is a schematic diagram of an LED support in another example provided by Embodiment III of the present invention;

FIG. 5-1 is a schematic diagram of a conductive base in an example provided by Embodiment IV of the present invention;

FIG. 5-2 is a schematic diagram of an LED support in an example provided by Embodiment IV of the present invention;

FIG. 5-3 is a schematic diagram of a conductive base in another example provided by Embodiment IV of the present invention;

FIG. 5-4 is a schematic diagram of an LED support in another example provided by Embodiment IV of the present invention;

FIG. 5-5 is a schematic diagram of a conductive base in yet another example provided by Embodiment IV of the present invention;

FIG. 5-6 is a schematic diagram of an LED support in yet another example provided by Embodiment IV of the present invention;

FIG. 6-1 is a schematic diagram of a manufacturing method of an LED support provided by Embodiment V of the present invention;

FIG. 6-2 is a schematic diagram of a manufacturing process of an LED support provided by Embodiment V of the present invention;

FIG. 6-3 is a schematic diagram of a manufacturing method of an LED lamp bead provided by Embodiment V of the present invention;

FIG. 7-1 is a schematic diagram (I) of an LED lamp bead in an example provided by embodiment VI of the present invention;

FIG. 7-2 is a schematic diagram (II) of an LED lamp bead in another example provided by embodiment VI of the present invention;

FIG. 7-3 is a schematic diagram (III) of an LED lamp bead in yet another example provided by embodiment VI of the present invention;

FIG. 7-4 is a schematic diagram of a light-emitting unit module in an example provided by embodiment VI of the present invention; and FIG. 7-5 is a schematic diagram of a display device in an example provided by embodiment VI of the present invention.

DETAILED DESCRIPTION

Figure 1:
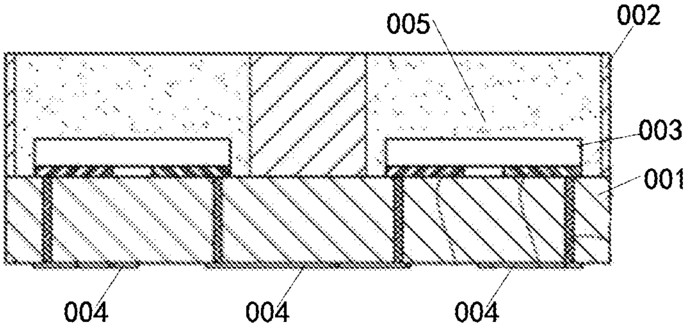
FIG. 1(PRIOR ART)
FIG. 1 is a schematic structural diagram of an existing LED structure.

In order to make the purpose, technical solutions, and advantages of the present invention clearer, the following further illustrate in detail embodiments of the present invention through specific implementations with reference to the drawings. It should be understood that the specific embodiments described herein are merely intended to explain and not to limit the present invention.

Embodiment I

This embodiment provides a conductive base that is applicable to an LED support and an LED lamp bead, allowing the LED support and the lamp bead to have simple structures, low costs, desirable heat dissipation performances, and simple and reliable soldering. The conductive base includes at least two metal pads insulated and isolated from each other. The metal pads are bonded to a colloid configured to form a support housing to form the LED support. Upper surfaces of the metal pads are located at a bottom of a bowl cup defined by the support housing and configured for the LED chip to be placed, and are at least partially exposed. The upper surface of at least one of the metal pads is configured to bear the LED chip, and an exposed region of the upper surface of each of the metal pads is configured to be electrically connected to an electrode of a corresponding LED chip. At least parts of lower surfaces of the metal pads are exposed from the support housing. The lower surfaces are surfaces opposite to the upper surfaces. At least part of a first side surface of at least one of the metal pads located between the upper surface and the lower surface is exposed from the support housing. Since the LED chip may be directly arranged on the upper surface of the metal pad, and the lower surface and the first side surface of the metal pad are exposed from the support housing, heat generated by the LED chip during operation can be directly transferred to the metal pad and quickly dissipated through the metal pad. The heat dissipation path is significantly shortened, and the heat dissipation area is significantly increased, thereby considerably improving the heat dissipation effect and ensuring the performance of the LED lamp bead.

In this embodiment, a first notch configured to accommodate a solder is arranged in a region of the lower surface of the metal pad exposed from the support housing, and a set soldering shape is formed in the region of the first side surface exposed from the support housing. The arrangement of the first notch and the set soldering shape can increase the soldering area, thereby improving the soldering strength. The arrangement of the first notch accommodates excessive solder during soldering, so that the soldering flatness and reliability are ensured.

In this embodiment, the LED support may directly be composed of at least two metal pads insulated and isolated from each other and the colloid bonded to the metal pads to form the support housing. This structure is much simpler than an existing LED support. Therefore, the manufacturing process thereof can be simplified, the production efficiency and yield rate can be improved, and the cost can be reduced.

It should be understood that a quantity of the metal pads included in one LED support in this embodiment may be flexibly set according to specific application scenarios. For example, merely two metal pads insulated and isolated from each other may be arranged, the support housing may merely defines one bowl cup, and at least parts of the upper surfaces of the two metal pads insulated and isolated from each other are exposed from a bottom of the bowl cup, so as to carry the LED chip and complete an electrical connection to the electrodes of the LED chip. A quantity of LED chips arranged in the bowl cup and colors of emitted lights of the LED chips may be flexibly set as required. For example, one LED chip may be arranged, or two or three LED chips may be arranged.

The LED chip in this embodiment may be a flip LED chip. Two electrodes of the flip LED chip may directly span the exposed upper surfaces of the two adjacent metal pads to realize the completion of electrical connection while bearing the LED chip. The LED chip in this embodiment may alternatively be a face-up LED chip. One face-up LED chip may be arranged on the upper surface of any of the metal pads, or may span the upper surfaces of a plurality of metal pads, and two electrodes of the face-up LED chip are respectively electrically connected to the exposed upper surfaces of two corresponding metal pads through leads.

In some application examples of this embodiment, the conductive base may include three metal pads arranged in sequence. The exposed region of the upper surface of the metal pad arranged in middle is electrically connected to the corresponding electrodes of two LED chips, and the exposed regions on the upper surfaces of the metal pads on both sides are electrically connected to corresponding remaining electrodes of the two LED chips, thereby realizing a series connection between the two LED chips. In this example, the three metal pads may alternatively be located at a bottom of the same bowl cup. In some other application scenarios of this example, the support housing may further include an isolation wall arranged on the upper surface of the metal pad arranged in middle so as to form two isolated bowl cups on the upper surfaces of the three metal pads (or a large bowl cup may be formed on the three metal pads without the arrangement of the isolation wall). In this case, the middle metal pad spans the bottoms of the two bowl cups isolated from each other, and the two metal pads are respectively located at the bottoms of the two bowl cups isolated from each other. A specific structure may be flexibly set as required. In this application example, a quantity and colors of the LED chips arranged in one bowl cup as well as a specific selection of the face-up LED chips or the flip LED chips may be flexibly set as required. In some application scenarios of this application example, the first side surface and/or the lower surface of the metal pad arranged in middle may not be exposed from the support housing as required. When the first side surface and/or the lower surface of the metal pad arranged in middle may be exposed from the support housing as required, the first side surface and/or the lower surface of the metal pad arranged in middle may be selectively soldered, or the first side surface and/or the lower surface of the metal pad arranged in middle may selectively be not soldered. This may specifically be flexibly selected according to application scenarios.

It should be understood that the set soldering shape arranged in the region of the first side surface exposed from the support housing in this embodiment may be flexibly set. For example, the set soldering shape may include but is not limited to any of the following:

a second notch formed on the first side surface, where the arrangement of the second notch can increase the soldering area, thereby improving the soldering strength, and the second notch is configured to accommodate excessive solder during soldering, so that soldering flatness and reliability are ensured;

a protrusion protruding from the support housing formed on the first side surface, where the protrusion can not only enlarge a heat dissipation surface for directly dissipating heat to the exterior but also be used as a soldering region; compared with an arrangement that is flush with or lower than the support housing, the soldering region provides a larger soldering area, and realizes more desirable stability after soldering; therefore, the soldering area can be significantly increased, the soldering firmness can be improved, and the heat dissipation area can be increased, thereby improving the reliability of a product comprehensively; optionally, in order to further increase the soldering area and enhance the soldering reliability and flatness, a fourth notch configured to accommodate solder may be arranged on the protrusion, and the shape and the size of the fourth notch may be flexibly set; and a non-rectangular shape flush with the support housing formed on the first side surface, where, in some examples, the non-rectangular shape may include but is not limited to at least one of an I shape, an H shape, a horseshoe shape, an arc shape, a cross shape, an X shape, or an 8 shape, which may specifically be flexibly set according to an application scenario; the non-rectangular shape not only facilitates the soldering operation but also increases the soldering area and further facilitates manufacture of the metal pad or cutting during manufacture of the LED support; by arranging the region of the first side surface and/or the lower surface of at least one of the metal pads exposed from the support housing to be flush with the support housing, a soldering gap between the LED support and a circuit board can be reduced after the manufacture of the LED support is completed, thereby improving the soldering reliability of the LED support; in this embodiment, the regions on the first side surfaces of some of the metal pads exposed from the support housing may be arranged to be flush with the support housing as required; however, in another application scenario of this embodiment, a third surface of each of the metal pads is arranged to be exposed from the support housing, and the region exposed from the support housing is arranged to be flush with the support housing; in this application scenario, optionally, the lower surface of each of the metal pads may be arranged to be exposed from the support housing and flush with the support housing.

In some examples of this embodiment, the second side surface of at least one of the metal pads located between the upper surface and the lower surface may be not exposed from the support housing (that is, located inside the support housing), and the first side surface and the second side surface are two opposite side surfaces. That is to say, in this example, at least parts of the upper surface, the lower surface, and the first side surface of the metal pad may be arranged to be exposed from the support housing, and other surfaces are covered by the support housing, which increases the bonding area between the support housing and the metal pad, improves the bonding strength between the support housing and the metal pad, and improves the reliability of the LED support. Moreover, the air tightness of the LED support is more desirable, which improves the safety and the reliability of an LED product.

In some other examples of this embodiment, at least part of the second side surface of at least one of the metal pads between the upper surface and the lower surface may be arranged to be exposed from the support housing. That is to say, in this example, at least parts of the lower surface, the first side surface, and the second side surface of the metal pad may be arranged to be exposed from the support housing, which can significantly increase the heat dissipation area. In this way, the heat dissipation effect is significantly improved, and the performance of a light-emitting unit is ensured. In addition, at least parts of the lower surface, the first side surface, and the second side surface of at least one of the metal pads are exposed from the support housing. The exposed regions all may be used as solder pads for external electrical connection. Thus, at least one of the exposed regions of the lower surface, the first side surface, and the second side surface may be flexibly selected for soldering according to a demand of a specific application scenario. Therefore, various application scenarios are feasible, and the soldering is convenient. Soldering may be further performed on two or three of the surfaces as required, which can improve the soldering firmness and improve the reliability of a product. Optionally, in this example, a third notch configured to accommodate solder may be arranged in a region of the second side surface exposed from the support housing.

Optionally, in this embodiment, when the first notch and the second notch are arranged, the first notch may be in communication with the second notch, and/or, when the first notch and the third notch are arranged, the first notch may in communication with the third notch.

Optionally, in this embodiment, in order to further improve the soldering reliability, a flux layer configured to enhance a soldering force may be arranged in a region of the metal pad exposed from the support housing and requiring soldering. The flux layer may be a metal layer, such as a metal coating, or may be other layer structures that can enhance the soldering force. For example, in some examples, the flux layer configured to enhance the soldering force, such as a metal coating, may be arranged on at least one inner wall of the first notch, the second notch, the third notch, and the fourth notch in the above examples (the inner wall of the notch is formed by an inner surface of the metal pad after a corresponding notch is provided on the metal pad). The metal coating may be but is not limited to a silver coating.

In this embodiment, the shape of at least one of the first notch, the second notch, the third notch, and the fourth notch arranged in the region of the lower surface of the metal pad exposed from the support housing may be flexibly set. For example, the shape may be but is not limited to a slot or a hole.

In this embodiment, the first notch arranged on the lower surface of the metal pad may alternatively not be in communication with the second notch arranged on the first side surface of the metal pad. For example, in the side emitting application scenario, the first side surface of the metal pad may be arranged to be coplanar with the support housing. When the first side surface is placed on a soldering surface provided with solder as a main mounting surface. The first side surface squeezes the solder on the soldering surface, and a part of the solder spills outward along the first side surface. During heating and soldering, since the solder converges to the metal pad when heated, the spilling solder can preferentially converge to the first notch arranged on the lower surface to complete the bonding with the lower surface. Moreover, the solder under the first side surface is bonded to the first surface, thus realizing soldering of the first side surface to the lower surface, which improves the soldering reliability. In addition, the arrangement of the first notch and the second notch can increase the soldering area compared with a planar arrangement, and can accommodate excessive solder, which can further improve the soldering stability and improve soldering flatness. In the front emitting application scenario, the lower surface of the metal pad may be arranged to be coplanar with the support housing. A soldering process in which the lower surface of the metal pad is placed on the soldering surface provided with the solder as the main mounting surface is similar to the soldering process in the side emitting application scenario. Therefore, the details are not repeatedly described herein.

As described above, in this embodiment, the first notch arranged on the lower surface of the metal pad may also be arranged to be in communication with the second notch arranged on the first side surface of the metal pad. This communication structure can form a better guide for a liquid solder and can more reliably ensure that the excessive solder is accommodated in the notch. In this embodiment, when the first notch is in communication with the second notch, communication may be formed inside the metal pad or may be formed on the lower surface of the metal pad and an outer surface of the first side surface. A structure of the communicated part between the first notch and the second notch may be a slot, a hole, or other structures. For example, in the side emitting application scenario, when the first side surface is placed on the soldering surface provided with solder, the first side surface squeezes the solder on the soldering surface. Since the first notch is in communication with the second notch, a part of the solder squeezed to the second notch may directly flow into the first notch along a position where the first notch and the second notch are communicated, which ensures that the first notch and the second notch both have the solder therein, thereby ensuring that the lower surface and the first side surface are both soldered. When a part of the solder spills outward along the first side surface, since the solder converges to the metal pad during heating, the spilling solder can preferentially converge to the first notch on the lower surface. It can be learned that the communication between the first notch and the second notch can realize more desirable soldering of the first side surface and the lower surface and improve the soldering reliability. In the front emitting application scenario, a soldering process in which the lower surface of the metal pad is placed on the soldering surface provided with the solder is similar to the soldering process in the side emitting application scenario. Therefore, the details are not repeatedly described herein.

Communication or non-communication between the first notch and the third notch may be flexibly set as required with reference to the arrangement of first notch and the second notch. Therefore, the details are not repeatedly described herein.

For ease of understanding, description is provided below with reference to the drawings in this embodiment. Referring to a conductive base 1 and an LED support shown in FIG. 2-1 to FIG. 2-3, the conductive base 1 includes a first metal pad 11, a second metal pad 12, and a third metal pad 13 arranged in sequence and insulated and isolated from each other. At least parts of upper surfaces (a) of the first metal pad 11 and the third metal pad 13 are exposed from a bottom of a bowl cup, and an upper surface (a) of the second metal pad 12 is also at least partially exposed from the bottom of the bowl cup. A lower surface (b) is a surface opposite to the upper surface, and a first side surface (c) is a surface located between the upper surface (a) and the lower surface (b). In this example, a second notch c1 in the shape of a horseshoe-shaped groove is arranged in a region of the first side surface (c) of each of the first metal pad 11, the second metal pad 12, and the third metal pad 13 exposed from a side surface 22 of a support housing 2. Optionally, the region of the first side surface (c) of each of the first metal pad 11, the second metal pad 12, and the third metal pad 13 exposed from the support housing 2 and not provided with a second notch is arranged to be flush with the side surface 22 of the support housing 2. A first notch b1 in the shape of a square hole is arranged in a region of the lower surface (b) of each of the first metal pad 11, the second metal pad 12, and the third metal pad 13 exposed from a lower surface 23 of the support housing 2. In this example, the first notch b1 is not in communication with the second notch c1. Optionally, in this embodiment, a region of the lower surface (b) of each of the first metal pad 11, the second metal pad 12, and the third metal pad 13 exposed from the lower surface 23 of the support housing 2 and not provided with a second notch may be flush with the lower surface 23 of the support housing 2. 21 in FIG. 2-2 is an upper surface of the support housing and may be parallel to the upper surface (a) of the metal pad, but the present invention is not limited thereto.

Figures 1, 2:
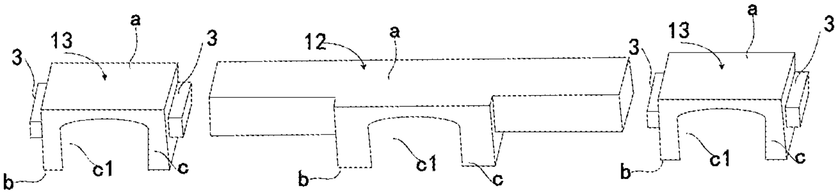
Figure 2:
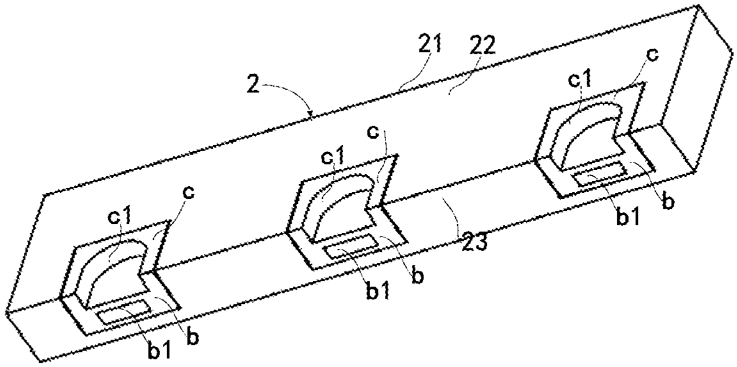
Figures 2, 3:
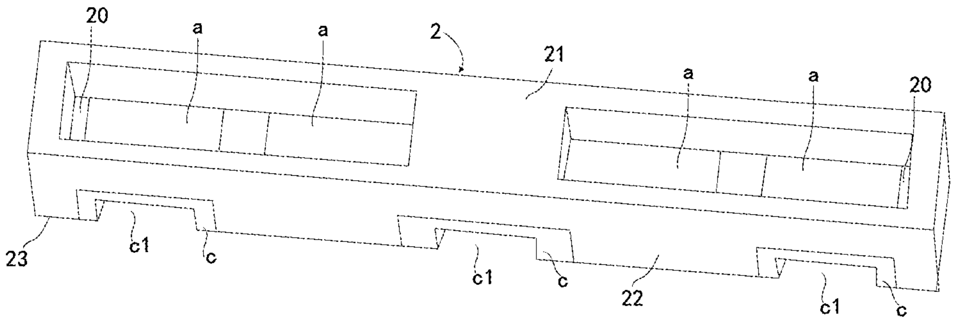

For example, still referring to FIG. 2-1 to FIG. 2-3, in this example, a bulge 3 protruding outward is arranged on each of a left side and a right side of each of the first metal pad 11 and the third metal pad 13 between the upper surface and the lower surface. A shape, a size, and the like of the bulge 3 may be flexibly arranged. In addition, in some examples, the bulge 3 may also be arranged on only one of the left side and the right side of each of the first metal pad 11 and the third metal pad 13, or the bulge 3 may be flexibly arranged on at least one of a front side, a rear side, a left side, and a right side of each of the first metal pad 11 and the third metal pad 13 as required. This may be specifically flexibly arranged as required. Refer to FIG. 2-2 and FIG. 2-3, in this embodiment, after the LED support is formed, the bulge 3 arranged on the metal pad is embedded into the support housing, and a colloid 20 forming the support housing is flush with the upper surface (a) of the metal pad at the bottom of the bowl cup. Specifically, referring to FIG. 2-3, the colloid 20 exists between the upper surface (a) of the metal pad and a side wall of the support housing, and the colloid 20 is arranged to be flush with the upper surface (a). In this arrangement example, a thickness of the side wall of the support housing is not limited. The side wall may be arranged to be relatively thin in as long as a demand for the strength of the LED support is satisfied. In this way, an overall size of the LED support is reduced, which facilitates miniaturization of the LED support. It should be understood that, for the arrangement of the bulge 3 on the second metal pad 12, one may refer to the arrangement of the bulge on the first metal pad 11 or the third metal pad 13, or the bulge 3 may alternatively not be arranged. This may be specifically flexibly arranged as required. Optionally, in this example, the bulge 3 arranged on the metal pad may be a bulge inclined toward the lower surface of the metal pad. An inclination angle may be flexibly set as any value between 30° and 70°, such as 30°, 45°, 60°, or 70°.

Figures 2, 3, 4:
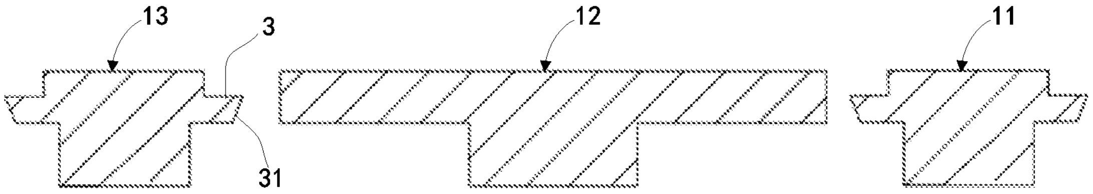

In some examples of this embodiment, in order to further enhance the stability of bonding between the metal pad and the support housing, a side surface of the bulge 3 of at least one of the metal pads may be arranged as an inclined surface. An inclination angle of the inclined surface may be flexibly set as required. For example, as shown in FIG. 2-4, a side surface 31 of each of the bulges 3 on an upper end of each of the first metal pad 11 and the third metal pad 13 is an inclined surface. Compared with a structure of a non-inclined surface, the inclined surface can have a larger contact area with the support housing and bear a pressure of the support housing on the metal pad more effectively after being bonded to the support housing. In this way, the bonding force between the metal pad and the support housing can be improved more effectively. Certainly, a structure similar to the bulge 3 on each of the first metal pad 11 and the third metal pad 13 may be arranged on the second metal pad 12 as required.

Referring to another conductive base 1 and an LED support shown in FIG. 2-5 to FIG. 2-6, the conductive base 1 also includes a first metal pad 11, a second metal pad 12, and a third metal pad 13 arranged in sequence and insulated and isolated from each other. At least parts of upper surfaces (a) of the first metal pad 11 and the third metal pad 13 are exposed from a bottom of a bowl cup, and an upper surface (a) of the second metal pad 12 is also at least partially exposed from the bottom of the bowl cup. A lower surface (b) is a surface opposite to the upper surface, and a first side surface (c) is a surface located between the upper surface (a) and the lower surface (b). As shown in FIG. 2-5 to FIG. 2-6, in this example, a second notch c1 in the shape of a horseshoe-shaped groove is arranged in a region of the first side surface (c) of each of the first metal pad 11, the second metal pad 12, and the third metal pad 13 exposed from a side surface 22 of a support housing 2. Optionally, a region of the first side surface (c) of each of the first metal pad 11, the second metal pad 12, and the third metal pad 13 exposed from the support housing 2 and not provided with a second notch is arranged to be flush with the side surface 22 of the support housing 2. A first notch b1 in the shape of a square hole is arranged in a region of the lower surface (b) of each of the first metal pad 11, the second metal pad 12, and the third metal pad 13 exposed from a lower surface 23 of the support housing 2. In this example, the first notch b1 is in communication with the second notch c1. Optionally, in this embodiment, a region of the lower surface (b) of each of the first metal pad 11, the second metal pad 12, and the third metal pad 13 exposed from the lower surface 23 of the support housing 2 and not provided with a second notch may be flush with the lower surface 23 of the support housing 2.

Referring to another conductive base 1 and an LED support shown in FIG. 2-7 to FIG. 2-8, the conductive base 1 includes a first metal pad 11, a second metal pad 12, and a third metal pad 13 arranged in sequence and insulated and isolated from each other. At least parts of upper surfaces (a) of the first metal pad 11 and the third metal pad 13 are exposed from a bottom of a bowl cup, and an upper surface (a) of the second metal pad 12 is also at least partially exposed from the bottom of the bowl cup. A lower surface (b) is a surface opposite to the upper surface, and a first side surface (c) is a surface located between the upper surface (a) and the lower surface (b). As shown in FIG. 2-7 to FIG. 2-8, in this example, a second notch c1 in the shape of a circular hole is arranged in a region of the first side surface (c) of each of the first metal pad 11, the second metal pad 12, and the third metal pad 13 exposed from a side surface 22 of a support housing 2. Optionally, a region of the first side surface (c) of each of the first metal pad 11, the second metal pad 12, and the third metal pad 13 exposed from the support housing 2 and not provided with a second notch c1 is arranged to be flush with the side surface 22 of the support housing 2. A first notch b11 in the shape of a square hole is arranged in a region of the lower surface (b) of each of the first metal pad 11, the second metal pad 12, and the third metal pad 13 exposed from the lower surface 23 of the support housing 2. Optionally, in this embodiment, a region of the lower surface (b) of each of the first metal pad 11, the second metal pad 12, and the third metal pad 13 exposed from the lower surface 23 of the support housing 2 but not provided with a second notch is arranged to be flush with the lower surface 23 of the support housing 2. In this example, the first notch b1 is in communication with the second notch c1 inside the metal pad.

Referring to another conductive base 1 and an LED support shown in FIG. 2-9 to FIG. 2-10, the conductive base 1 includes a first metal pad 11, a second metal pad 12, and a third metal pad 13 arranged in sequence and insulated and isolated from each other. At least parts of upper surfaces (a) of the first metal pad 11 and the third metal pad 13 are exposed from a bottom of a bowl cup, and an upper surface (a) of the second metal pad 12 is also at least partially exposed from the bottom of the bowl cup. A lower surface (b) is a surface opposite to the upper surface, and a first side surface (c) is a surface located between the upper surface (a) and the lower surface (b). As shown in FIG. 2-9 to FIG. 2-10, in this example, a second notch c1 in the shape of a square groove is arranged in a region of the first side surface (c) of each of the first metal pad 11, the second metal pad 12, and the third metal pad 13 exposed from a side surface 22 of a support housing 2. Optionally, a region of the first side surface (c) of each of the first metal pad 11, the second metal pad 12, and the third metal pad 13 exposed from the support housing 2 and not provided with a second notch c1 are arranged to be flush with the side surface 22 of the support housing 2. A first notch b1 in the shape of a square groove is arranged in a region of the lower surface (b) of each of the first metal pad 11, the second metal pad 12, and the third metal pad 13 exposed from the lower surface 23 of the support housing 2. Optionally, in this embodiment, a region of the lower surface (b) of each of the first metal pad 11, the second metal pad 12, and the third metal pad 13 exposed from the lower surface 23 of the support housing 2 and not provided with a second notch is arranged to be flush with the lower surface 23 of the support housing 2. In this example, the first notch b1 is in communication with the second notch c1 on an outer surface of the metal pad.

It should be understood that, in this embodiment, the shapes of the first notches and/or the second notches arranged on the metal pads may be the same or at least partially different. This may be specifically flexibly set according to an application scenario. For example, as shown in a conductive base in FIG. 2-11. The second notch c1 arranged in the region of the first side surface (c) of the first metal pad 11 exposed from the support housing 2 is a circular hole, and the second notch c1 arranged in the region of the first side surface (c) of each of the second metal pad 12 and the third metal pad 13 exposed from the support housing 2 is a square groove. Similarly, the first notch b 1 may be flexibly arranged as required.

Optionally, in an example of this embodiment, a maximum transverse width W1 of an upper end of at least one of the metal pads close to the upper surface may be set to be greater than or equal to a maximum transverse width W2 of the region of the first side surface of the metal pad exposed from the support housing. For example, W1 may be set to be greater than W2. In this way, during formation of the LED support, a part of the upper end of the conductive metal substrate is embedded into the colloid of the support housing, so that the stability of the bonding between the metal pad and the support housing can be enhanced. For example, as shown in FIG. 2-5, the maximum transverse width W1 of the upper end of the second metal pad 12 close to the upper surface is greater than the maximum transverse width W2 of the region of the first side surface thereof exposed from the support housing. Certainly, at least one of the first metal pad 11 and the third metal pad 13 may be configured with a similar structure.

Optionally, in an example of this embodiment, a maximum transverse width W4 of the region of the lower surface of at least one of the metal pads exposed from the support housing may be set to be greater than or equal to the maximum transverse width W2 of the region of the first side surface of the metal pad exposed from the support housing. For example, as shown in FIG. 2-5, the maximum transverse width W4 of the region of the lower surface of the second metal pad 12 exposed from the support housing is greater than or equal to the maximum transverse width W2 of the region of the first side surface of the metal pad exposed from the support housing. Certainly, at least one of the first metal pad 11 and the third metal pad 13 may be configured with a similar structure. In this way, the heat dissipation area of the product can be increased, thereby improving the heat dissipation efficiency. In addition, the excessive solder can be soldered to the lower surface, thereby improving the soldering reliability.

For example, as shown in FIG. 2-5, in an example, the transverse width W1 of the upper end of the second metal pad 12 may be greater than the transverse width W2 of the first side surface, and the transverse width W2 of the first side surface is greater than the transverse width W3 of the second notch c1, so as to improve the bonding strength between the metal pad and the support housing.

In some examples of this embodiment, the transverse width W3 of the second notch on the middle metal pad (that is, the second metal pad 12) may be set to be greater than the transverse width W3 of the second notch on each of the two remaining metal pads (that is, the first metal pad 11 and the third metal pad 13), so that the second notch on the middle metal pad can accommodate more solder and facilitates rapid heat conduction more effectively, which improves heat conduction efficiency.

In some examples of this embodiment, in order to further enhance the stability of bonding between the metal pad and the support housing, a side surface of the upper end of at least one of the metal pads may be arranged as an inclined surface. An inclination angle of the inclined surface may be flexibly set as required. For example, the side surface of the upper end of each of the first metal pad 11 and the second metal pad 13 is an inclined surface. Compared with a structure of a non-inclined surface, the inclined surface can have a larger contact area with the support housing and bear a pressure of the support housing on the metal pad more effectively after being bonded to the support housing. In this way, the bonding force between the metal pad and the support housing can be improved more effectively. Certainly, the side surface of the upper end of the second metal pad 12 may be arranged as an inclined surface as required.

Certainly, in some application examples, the transverse width of the upper end of the metal pad close to the upper surface is the same or substantially the same as that of a lower end close to the lower surface. In this case, the bonding between the support housing and the metal pad may be realized through a bonding force of a bonding region between the support housing and the metal pad. This may be specifically flexibly set as required.

Optionally, in order to further improve the firmness of the bonding between the metal pad and the support housing, a rough surface with a concave-convex structure for enhancing the bonding force with the support housing (certainly, the rough surface with the concave-convex structure for enhancing the bonding force with the support housing may be arranged in other regions of the metal pad contacting the support housing) and/or a bonding hole for inflow of the colloid forming the support housing is arranged in a region of the upper surface of the metal pad bonded to the support housing.

Optionally, in this embodiment, the bonding hole arranged on the upper surface of the metal pad may be in communication with the first notch arranged on the lower surface of the metal pad, and may be in communication with the second notch arranged on the first side surface.

Optionally, in this embodiment, an end of the bonding hole close to the upper surface is an upper end, and an end close to the lower surface is a lower end. A diameter of the upper end of the bonding hole is greater than a diameter of the lower end of the bonding hole. That is to say, at least one gradient protruding surface is provided between the upper end and the lower end of the bonding hole. In this way, the contact area between the bonding hole and the colloid for forming the support housing can be further increased, thereby further improving the bonding strength between the bonding hole and the colloid.

For example, an arrangement example is shown in FIG. 2-12. A rough surface al having a concave-convex structure is arranged in a region of the upper surface (a) of each of the first metal pad 11, the second metal pad 12, and the third metal pad 13 configured for contact with the support housing. For another example, as shown in FIG. 2-13, a bonding hole a2 having a protruding structure is arranged in the region of the upper surface (a) of each of the first metal pad 11, the second metal pad 12, and the third metal pad 13 configured for contact with the support housing. Certainly, in other arrangement examples, the rough surface a1 having the concave-convex structure and the bonding hole a2 having the protruding structure both may be arranged in the region of the upper surface (a) of the at least one of the first metal pad 11, the second metal pad 12, and the third metal pad 13 configured for contact with the support housing.

Embodiment II

For ease of understanding, this embodiment is illustrated by using a structure in which at least part of the second side surface of the at least one of the metal pads located between the upper surface and the lower surface is exposed from the support housing as an example. That is to say, in this embodiment, at least parts of the upper surface, the lower surface, the first side surface, and the second side surface of the metal pad may be arranged to be exposed from the support housing, and other surfaces are covered by the support housing, which increases the bonding area between the support housing and the metal pad, improves the bonding strength between the support housing and the metal pad, and improves the reliability of the LED support. Moreover, the air tightness of the LED support is more desirable, which improves the safety and the reliability of an LED product.

For example, referring to FIG. 3-1 to FIG. 3-2, a conductive base of an LED support includes a first metal pad 11, a second metal pad 12, and a third metal pad 13. At least parts of upper surfaces (a) of the three metal pads are exposed from a bottom of a bowl cup. A lower surface (b) is a surface opposite to the upper surface, a first side surface (c) is a surface located between the upper surface (a) and the lower surface (b), and a second side surface (d) (not shown) is a surface opposite to the first side surface (c). In this example, a region of the first side surface (c) of each of the first metal pad 11, the second metal pad 12, and the third metal pad 13 exposed from a side surface 22 of a support housing 2 is a planar region. Optionally, the region of the first side surface (c) of each of the first metal pad 11, the second metal pad 12, and the third metal pad 13 exposed the support housing 2 may be flush with the side surface 22 of the support housing 2 or slightly higher or lower than the side surface 22 of the support housing 2. In this embodiment, a region of the second side surface of each of the first metal pad 11, the second metal pad 12, and the third metal pad 13 exposed from a second side surface of the support housing 2 may be flush with the second side surface of the support housing 2 or slightly higher or lower than the second side surface of the support housing 2.

In this example, a region of the lower surface (b) of each of the first metal pad 11, the second metal pad 12, and the third metal pad 13 exposed from a lower surface 23 of the support housing 2 is also a plane. Besides, optionally, in this embodiment, the region of the lower surface (b) of each of the first metal pad 11, the second metal pad 12, and the third metal pad 13 exposed from the lower surface 23 of the support housing 2 may be flush with the lower surface 23 of the support housing 2 or slightly higher or lower than the lower surface 23 of the support housing 2. 21 in FIG. 2 is an upper surface of the support housing and may be parallel to the upper surfaces (a) of the metal pads, but the present invention is not limited thereto.

In the LED support shown in FIG. 3-2, three surfaces of the metal pads are exposed from the support housing. The surfaces of the metal pads may be used as solder pads and heat dissipation surfaces and may be flexibly applied to the soldering of various application scenarios, which can improve the heat dissipation area, thereby improving the heat dissipation effect.

For another example, referring to FIG. 3-3 to FIG. 3-4, a first notch c1 in the shape of a horseshoe-shaped groove is arranged in the region of the first side surface (c) of each of the first metal pad 11, the second metal pad 12, and the third metal pad 13 exposed from the side surface 22 of the support housing 2. Optionally, a region of the first side surface (c) of each of the first metal pad 11, the second metal pad 12, and the third metal pad 13 exposed from the support housing 2 and not provided with a first notch c1 may be flush with the side surface 22 of the support housing 2 or slightly higher or lower than the side surface 22 of the support housing 2. In this embodiment, the region of the second side surface of each of the first metal pad 11, the second metal pad 12, and the third metal pad 13 exposed from the second side surface of the support housing 2 may be a plane, and the region of the second side surface exposed from the support housing 2 may be flush with the second side surface of the support housing 2 or slightly higher or lower than the second side surface of the support housing 2. In this example, a region of the lower surface (b) of each of the first metal pad 11, the second metal pad 12, and the third metal pad 13 exposed from a lower surface 23 of the support housing 2 is also a plane. Optionally, in this embodiment, the region of the lower surface (b) of each of the first metal pad 11, the second metal pad 12, and the third metal pad 13 exposed from the lower surface 23 of the support housing 2 may be flush with the lower surface 23 of the support housing 2 or slightly higher or lower than the lower surface 23 of the support housing 2.

Figures 2, 3, 4, 5:
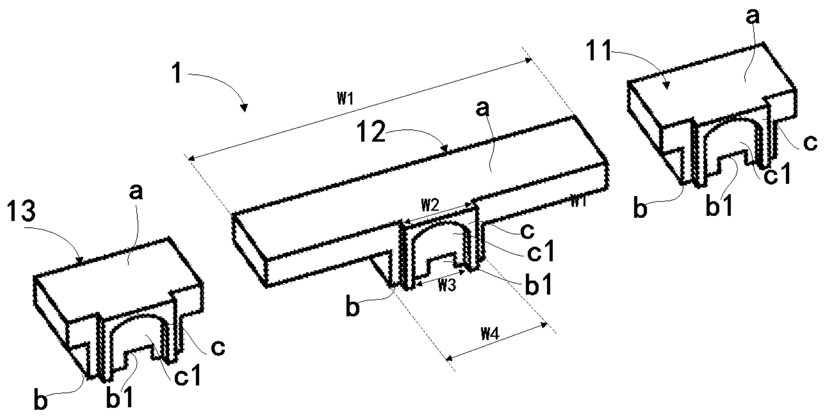

For another example, refer to an LED support shown in FIG. 3-5 to FIG. 3-7. FIG. 3-5 is a three-dimensional schematic diagram of the LED support. FIG. 3-6 is a projection view of a first side surface of a support housing of the LED support. FIG. 3-7 is a projection view of a second side surface of the support housing of the LED support. In this example, a first notch c1 in the shape of a horseshoe-shaped groove is arranged in the region of the first side surface (c) of each of first metal pad 11, the second metal pad 12, and the third metal pad 13 exposed from the side surface 22 of the support housing 2, and a third notch dl in the shape of a horseshoe-shaped groove is arranged in a region of the second side surface (d) of each of the first metal pad 11, the second metal pad 12, and the third metal pad 13 exposed from the second side surface of the support housing 2. Shapes and sizes of the third notch dl and the first notch c1 may be the same, and positions thereof may correspond to each other. Alternatively, the shapes and the sizes of the third notch d1 and the first notch c1 may be different, and the positions thereof may not correspond to each other. This may be specifically flexibly set as required. Optionally, in this embodiment, regions of the first side surface (c) and the second side surface (d) of each of the first metal pad 11, the second metal pad 12, and the third metal pad 13 exposed from the support housing 2 and not provided with a first notch c1 and a third notch d1 may be flush with the support housing 2 or slightly higher or lower than the support housing 2. In this example, a region of the lower surface (b) of each of the first metal pad 11, the second metal pad 12, and the third metal pad 13 exposed from a lower surface 23 of the support housing 2 is also a plane. Besides, optionally, in this embodiment, the region of the lower surface (b) of each of the first metal pad 11, the second metal pad 12, and the third metal pad 13 exposed from the lower surface 23 of the support housing 2 may be flush with the lower surface 23 of the support housing 2 or slightly higher or lower than the lower surface 23 of the support housing 2.

In this embodiment, the third notch may be or may not be in communication with the first notch. When the third notch is in communication with the first notch, excessive solder in one of the notches may directly flow into the other notch through the communication structure. For example, refer to an LED support as shown in FIG. 3-8. In this example, a first notch c1 in the shape of a horseshoe-shaped groove is arranged in the region of the first side surface (c) of each of first metal pad 11, the second metal pad 12, and the third metal pad 13 exposed from the side surface 22 of the support housing 2, and a third notch d1 in the shape of a horseshoe-shaped groove is arranged in a region of the second side surface (d) of each of the first metal pad 11, the second metal pad 12, and the third metal pad 13 exposed from the second side surface of the support housing 2. Shapes and sizes of the third notch d1 and the first notch c1 may be the same, and positions thereof may correspond to each other. Alternatively, the shapes and the sizes of the third notch d1 and the first notch c1 may be different, and the positions thereof may not correspond to each other. This may be specifically flexibly set as required. In this example, a horseshoe-shaped second notch b1 is arranged in a region of the lower surface (b) of each of the first metal pad 11, the second metal pad 12, and the third metal pad 13 exposed from the lower surface 23 of the support housing 2 (the horseshoe shape of the second notch b1 is a region between the first notch c1 and the third notch d1 in the shape of a horseshoe-shaped groove in FIG. 3-8, that is, a region defined by a horseshoe-shaped bulge between the first notch c1 and the third notch d1, where the first notch c1 is formed in a direction from the lower surface to the upper surface). The first notch c1 is communicated with the third notch d1 through the second notch b1. Besides, optionally, in this embodiment, a region of the lower surface (b) of each of the first metal pad 11, the second metal pad 12, and the third metal pad 13 exposed from the lower surface 23 of the support housing 2 and not provided with a second notch b1 may be flush with the lower surface 23 of the support housing 2 or slightly higher or lower than the lower surface 23 of the support housing 2. In this embodiment, regions of the first side surface (c) and the second side surface (d) of each of the first metal pad 11, the second metal pad 12, and the third metal pad 13 exposed from the support housing 2 and not provided with a first notch c1 and a third notch d1 may be flush with the support housing 2 or slightly higher or lower than the support housing 2.

Embodiment III

For ease of understanding, this embodiment is illustrated by using an example where the set soldering shape is a protrusion located in a region of a first side surface exposed from the support housing and protruding from the support housing.

As shown in FIG. 4-1 to FIG. 4-2, in this example, a region of a first side surface (c) of each of a first metal pad 11, a second metal pad 12, and a third metal pad 13 exposed from a side surface 22 of a support housing 2 protrudes from the support housing 2 to form the protrusion. A region of a lower surface (b) of each of the first metal pad 11, the second metal pad 12, and the third metal pad 13 exposed from a lower surface 23 of the support housing 2 is a planar region. Optionally, in this embodiment, the region of the lower surface (b) of each of the first metal pad 11, the second metal pad 12, and the third metal pad 13 exposed from the lower surface 23 of the support housing 2 may be flush with the lower surface 23 of the support housing 2 or may be arranged to protrude from the lower surface 23 of the support housing 2 or be slightly lower than the lower surface 23 of the support housing 2. 21 in FIG. 4-2 is an upper surface of the support housing, and may be parallel to the upper surfaces (a) of the metal pads, but the present invention is not limited thereto.

Optionally, in order to further increase the soldering area to improve the soldering reliability and flatness, a fourth notch configured to accommodate solder may be arranged in the region of the first side surface (c) of a metal pad protruding from the support housing. A shape and a size of the fourth notch may be flexibly set. For example, the fourth notch may be arranged as a fourth groove or a fourth hole or any other shape that can realize the above purpose. For example, an arrangement example is shown in FIG. 4-3 to FIG. 4-4. In this example, a fourth notch c4 in the shape of a horseshoe-shaped groove (or a round hole or a hole in another shape) is arranged in the region of the first side surface (c) of each of the first metal pad 11, the second metal pad 12, and the third metal pad 13 exposed from the side surface 22 of the support housing 2 (that is, each of the protrusions of the metal pads). Optionally, in this embodiment, the region of the lower surface (b) of each of the first metal pad 11, the second metal pad 12, and the third metal pad 13 exposed from the lower surface 23 of the support housing 2 may be flush with the lower surface 23 of the support housing 2.

Embodiment IV

For ease of understanding, this embodiment is illustrated by using an example where the set soldering shape is a non-rectangular shape located in a region of a first side surface exposed from a support housing.

For example, referring to FIG. 5-1 and FIG. 5-2, a region of a first side surface (c) of each of a first metal pad 11 and a third metal pad 13 exposed from a side surface 22 of a support housing 2 is arranged as an I shape or an H shape and is flush with the side surface 22 of the support housing 2. In FIG. 5-2, the region of the first side surface (c) of the second metal pad 12 exposed from the side surface 22 of the support housing 2 is a plane and is flush with the side surface 22. In FIG. 5-2, 21 is an upper surface of the support housing, and 23 is a lower surface of the support housing. A lower surface (b) of each of the first metal pad 11, the second metal pad 12, and the third metal pad 13 is also exposed from the lower surface 23 of the support housing 2, and is flush with the lower surface of the support housing.

In some examples of this embodiment, in order to further enhance the stability of bonding between the metal pad and the support housing, a side surface of the upper end of at least one of the metal pads may be arranged as an inclined surface. An inclination angle of the inclined surface may be flexibly set as required. Compared with a structure of a non-inclined surface, the inclined surface can have a larger contact area with the support housing and bear a pressure of the support housing on the metal pad more effectively after being bonded to the support housing. In this way, the bonding force between the metal pad and the support housing can be improved more effectively. Certainly, the side surface of the upper end of the second metal pad 12 may be arranged as an inclined surface as required.

For another example, refer to FIG. 5-3 and FIG. 5-4. In this example, the region of the first side surface (c) of each of the first metal pad 11, the second metal pad 12, and the third metal pad 13 exposed from the side surface 22 of the support housing 2 is arranged as an I shape or an H shape and is flush with the side surface 22 of the support housing 2. A lower surface (b) of each of the first metal pad 11, the second metal pad 12, and the third metal pad 13 is exposed from the lower surface 23 of the support housing 2, and is flush with the lower surface of the support housing.

Figures 2, 3, 4, 5, 6:
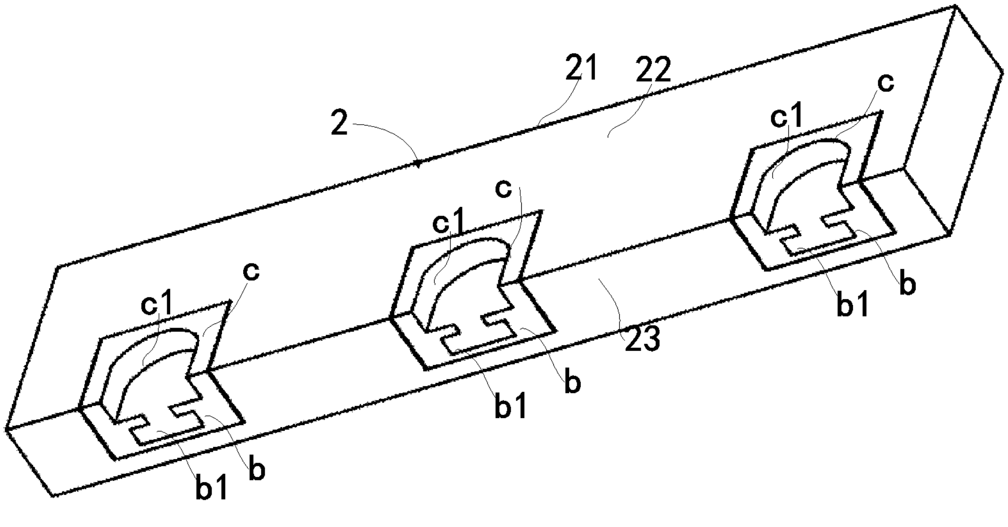

For another example, refer to FIG. 5-5 and FIG. 5-6 shows another example. In this example, the region of the first side surface (c) of each of the first metal pad 11, the second metal pad 12, and the third metal pad 13 exposed from the side surface 22 of the support housing 2 is arranged as a square horseshoe shape with an opening facing the lower surface (b). Certainly, the opening may also be arranged to face an upper surface (a). The region of the first side surface (c) of each of the first metal pad 11, the second metal pad 12, and the third metal pad 13 exposed from the side surface 22 of the support housing 2 is flush with the side surface 22 of the support housing 2. The lower surface (b) of each of the first metal pad 11, the second metal pad 12, and the third metal pad 13 is also exposed from the lower surface 23 of the support housing 2 and flush with the support housing. Certainly, the lower surface may be arranged not to be flush with the lower surface or arranged to be slightly higher or lower than the lower surface 23 of the support housing 2.

Embodiment V

This embodiment provides a manufacturing method of the LED support exemplified in the above embodiments. The conductive base assembly is placed in a corresponding die, where a cavity region formed in the die is correspondingly a to-be-formed support housing region. The conductive base assembly includes at least two conductive bases. One of the conductive bases correspondingly forms an LED support, the other of the conductive bases includes at least two metal pads insulated and isolated from each other, and a cutting position is arranged between adjacent conductive bases. The cavity region in the die is filled with a colloid for forming the support housing. The die is removed, and cutting is performed along the cutting position to obtain a single LED support. The manufacturing process is simple and quick, the efficiency of manufacturing of the LED support can be significantly improved, and die bonding and eutectic die bonding of the LED chip and the arrangement of the packaging layer may be completed before the cutting or after the single LED support is obtained. Therefore, the production process of the LED lamp bead is also significantly simplified, which can improve the production efficiency of the LED lamp bead and reduce the costs.

For ease of understanding, this embodiment is illustrated below using a manufacturing example of an LED support. As shown in FIG. 6-1 and FIG. 6-2, the manufacturing includes but is not limited to the following.

S601: Provide a conductive base assembly.

As shown in FIG. 6-2, the conductive base assembly 63 includes at least two conductive bases. One of the conductive bases correspondingly forms an LED support, the other of the conductive bases includes at least two metal pads insulated and isolated from each other, and a cutting position is arranged between adjacent conductive bases. An example of the cutting position is shown by an arrow Q in FIG. 6-2.

It should be understood that the metal pads in this embodiment may adopt any type of metal plates which can achieve a reliable conductive connection and have support strength satisfying a demand for an LED support. Since the metal plates have desirable heat dissipation performance, the heat dissipation performance of the LED support can be improved. Certainly, the metal plates may be replaced with other conductive plates made of other materials that can satisfy the demand. In this embodiment, specific shapes and sizes of the metal pads may be flexibly set according to an application requirement, which are not limited in this embodiment.

For example, in an application scenario of this embodiment, the metal pads may be but are not limited to copper substrates. The copper substrate has advantages such as low cost, easy processing, and desirable electrical and thermal conductivity.

Optionally, in some other application examples of this embodiment, a reflective layer may be further arranged at least in the exposed region of the upper surface of the metal pad to enhance the light emission efficiency, thereby improving the efficiency of an LED lamp bead. In this embodiment, the reflective layer may be but is not limited to a silver layer. The silver layer may be formed on the copper substrate through electroplating, chemical silvering, or the like, but the present invention is not limited thereto.

S603: Place the conductive base assembly in a corresponding die, where a cavity region formed in the die is correspondingly a to-be-formed support housing region.

An example is shown in FIG. 6-2. The die may include an upper die 62 and a lower die 61. A corresponding structure for forming the cavity region is arranged on each of the upper die 62 and the lower die 61. As shown in FIG. 6-2, after the upper die 62 and the lower die 61 are assembled together with the conductive base assembly 63 sandwiched therebetween, the cavity region that is formed is correspondingly the to-be-formed support housing region.

S605: Fill the cavity region in the die with a colloid and form a support housing after the colloid is cured.

An example is shown in FIG. 6-2. The colloid is filed into the cavity region in the die to form a support housing 64. A material of the colloid forming the support housing 64 in this embodiment may be flexibly selected as required. For example, thermosetting glue or hot pressing glue may be used, or white glue with more desirable reflection performance may be used, but the present invention is not limited thereto. For example, in an example, the material of the colloid may be but is not limited to epoxy or resin materials (such as epoxy glue, silica gel, or resin). It should be understood that, in this embodiment, one or more colloid injection ports in communication with the cavity region may be arranged on the die, and the colloid may be injected into the cavity region through the colloid injection ports. However, the present invention is not limited thereto.

S607: Remove the die. As shown in FIG. 6-2, the die may be removed through die opening in this embodiment.

S609: Perform cutting along the cutting position to obtain a single LED support.

An example is shown in FIG. 6-2. Cutting is performed along a dashed-line portion path (that is, a portion corresponding to the cutting position) in the figure, to obtain the single LED support. It should be understood that an overall shape of the LED support in this embodiment may be elongated, square, hexagonal, or the like. The overall formation of the LED support is not limited in this embodiment.

It can be learned that the manufacturing method of the LED support provided in this embodiment has fewer steps, the process in each step is simple, the manufacturing efficiency is high, the yield rate of the LED support obtained is high, and the costs are low.

This embodiment further provides an LED lamp bead. The lamp bead includes the LED support shown above, an LED chip arranged in the bowl cup, and a packaging layer arranged in the bowl cup and covering the LED chip. The LED chip may be a face-up LED chip or a flip LED chip. Electrodes of the LED chip are electrically connected to the exposed regions of the upper surfaces of the corresponding metal pads. For ease of understanding, two manufacturing methods for the LED lamp bead are exemplified below in this embodiment.

Method I: Referring to FIG. 6-3, the method includes but is not limited to the following.

S602: Provide a conductive base assembly.

The conductive base assembly includes at least two conductive bases. One of the conductive bases correspondingly forms an LED support, the other of the conductive bases includes at least two metal pads insulated and isolated from each other, and a cutting position is arranged between adjacent conductive bases. An example of the cutting position is shown by an arrow Q in FIG. 6-2.

S604: Place the conductive base assembly in a corresponding die, where a cavity region formed in the die is correspondingly a to-be-formed support housing region.

S606: Fill the cavity region in the die with a colloid and form a support housing after the colloid is cured.

S608: Remove the die, arrange the LED chip in the bowl cup, and electrically connect electrodes of the LED chip to the corresponding metal pads.

S610: Arrange, in the bowl cup, a packaging layer covering the LED chip.

The packaging layer in this embodiment may be a fluorescent glue layer or a combination of the fluorescent glue layer and a transparent adhesive layer, or may be a quantum dot (QD) film or a combination of the QD film and the transparent adhesive layer, or may be a combination of at least two of the fluorescent glue layer, the QD film, and the transparent adhesive layer.

S612: Perform cutting along the cutting position to obtain a single LED lamp bead.

An example is shown in FIG. 6-2. Cutting is performed along a dashed-line portion path (that is, a portion corresponding to the cutting position) in the figure, to obtain the single LED lamp bead.

Method II: After the LED support is manufactured using the manufacturing method of the LED support shown in FIG. 6-1, an LED chip is arranged in the bowl cup of the LED support, and an electrode of the LED chip is electrically connected to the corresponding metal pad, and then a packaging layer covering the LED chip is arranged in the bowl cup to obtain the single LED lamp bead.

Whichever method of manufacturing the LED lamp bead is adopted, the manufacturing process is simpler and more efficient than existing manufacturing methods of an LED lamp bead and can realize an LED lamp bead having a larger soldering area, a larger heat dissipation area, a shorter heat dissipation path, lower cost, and higher reliability.

Embodiment VI

This embodiment further provides an LED lamp bead. The lamp bead includes the LED support shown above, an LED chip arranged in the bowl cup, and a packaging layer arranged in the bowl cup and covering the LED chip. The LED chip may be a face-up LED chip or a flip LED chip. Electrodes of the LED chip are electrically connected to the exposed regions of the upper surfaces of the corresponding metal pads. The packaging layer in this embodiment may be a fluorescent glue layer or a combination of the fluorescent glue layer and a transparent adhesive layer, or may be a quantum dot (QD) film or a combination of the QD film and the transparent adhesive layer, or may be a combination of at least two of the fluorescent glue layer, the QD film, and the transparent adhesive layer.

The LED lamp bead provided in this embodiment is manufactured using the above LED support. For ease of understanding, description is provided below with reference to a plurality of lamp bead structure examples.

Figures 2, 3, 4, 5, 6, 7:
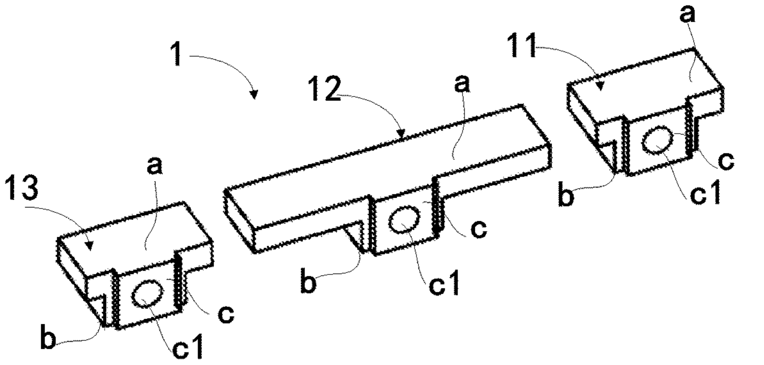
Figures 2, 3, 4, 5, 6, 7, 8:
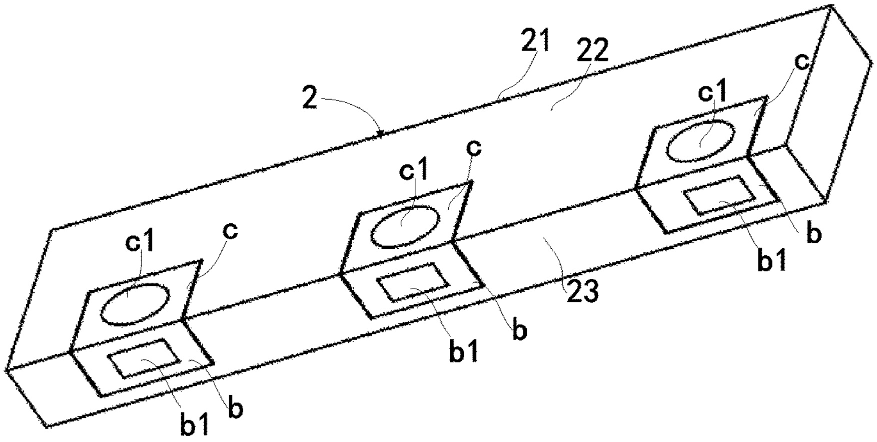
Figures 2, 3, 4, 5, 6, 7, 8, 9:
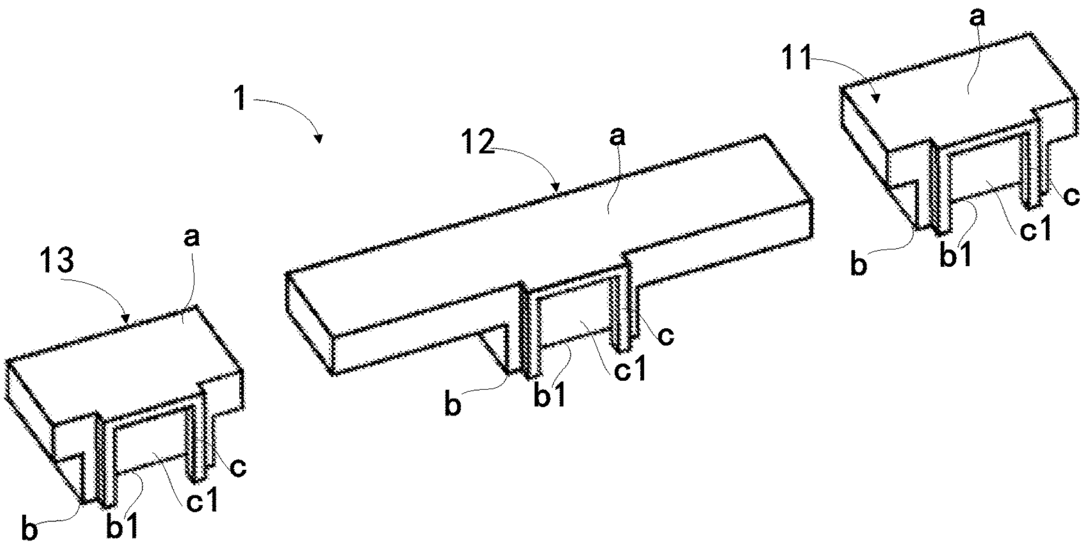
Figures 2, 3, 4, 5, 6, 7, 8, 9, 10:
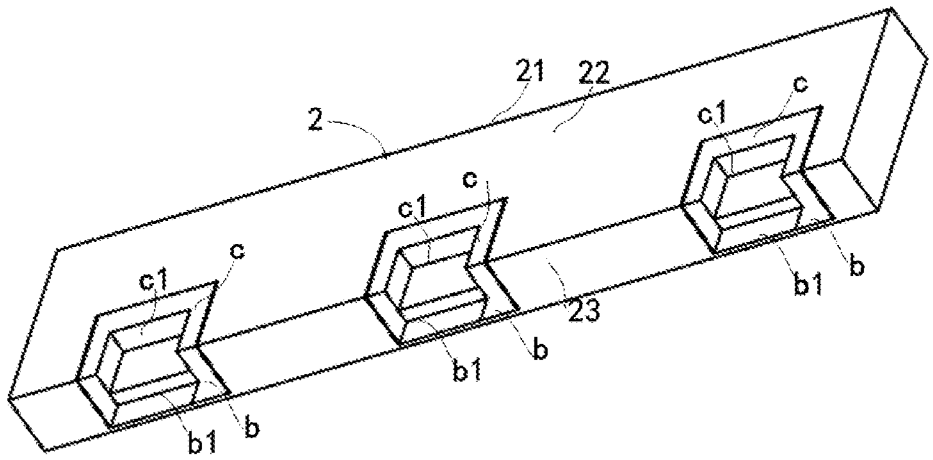
Figures 2, 3, 4, 5, 6, 7, 8, 9, 10, 11:
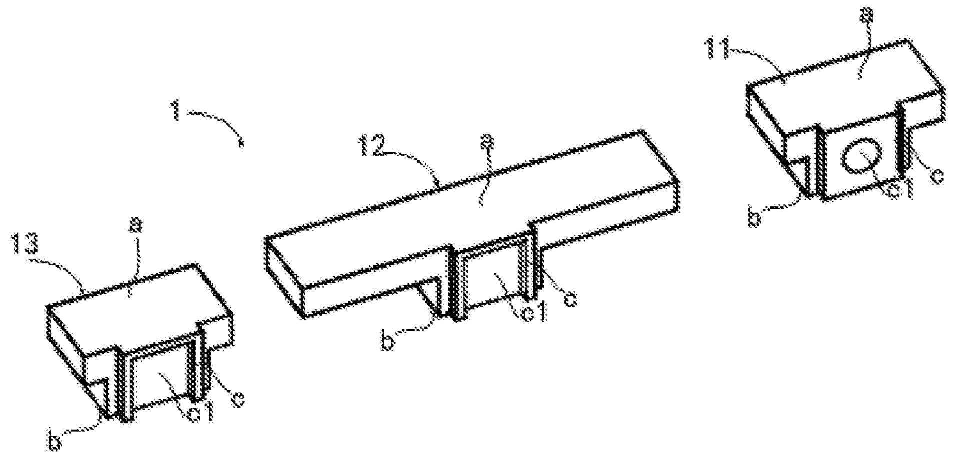
Figures 2, 3, 4, 5, 6, 7, 8, 9, 10, 11, 12:
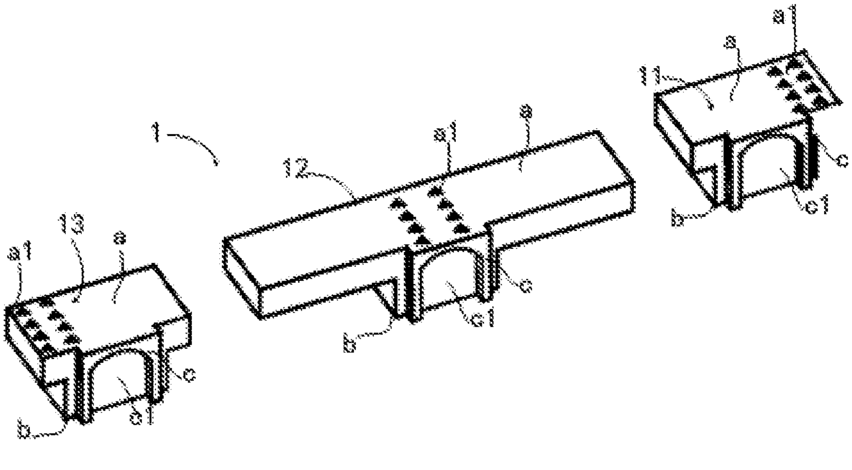
Figures 2, 3, 4, 5, 6, 7, 8, 9, 10, 11, 12, 13:
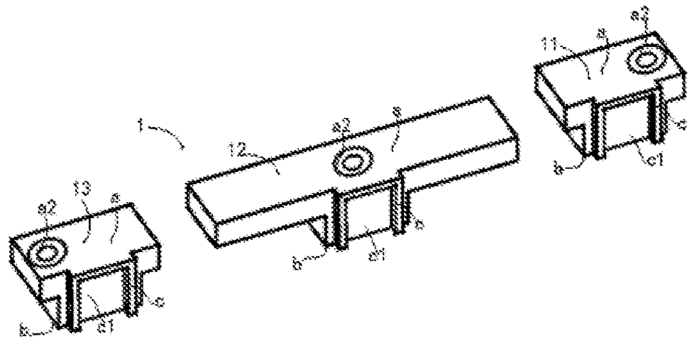
Figures 1, 3:
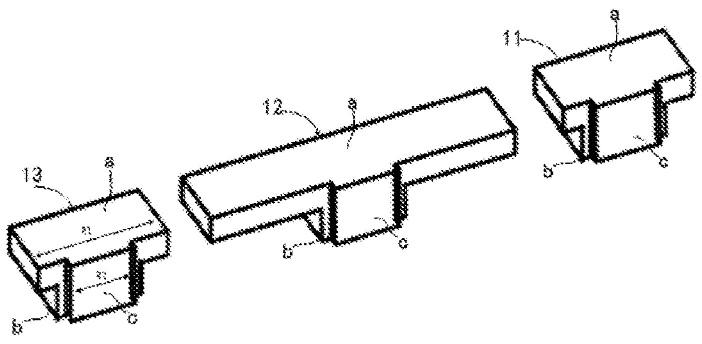
Figures 2, 3:
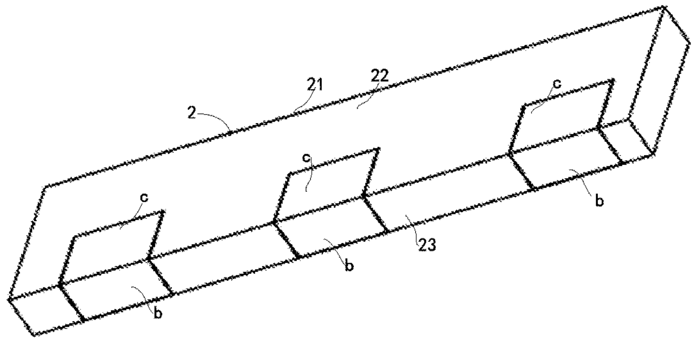
Figure 3:
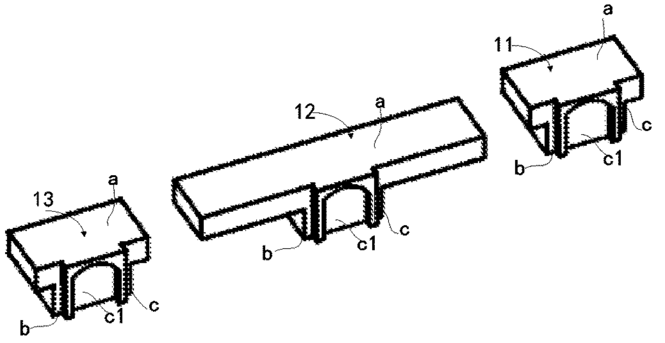
Figures 3, 4:
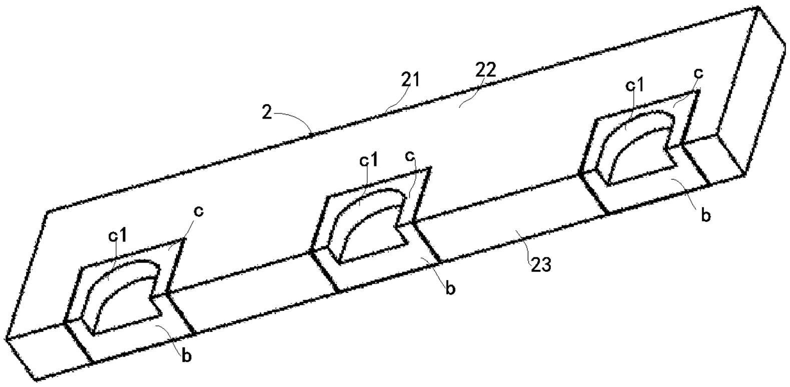
Figures 3, 4, 5:
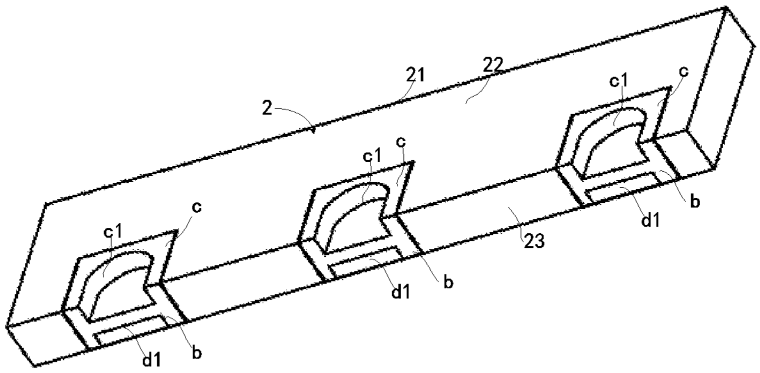
Figures 3, 4, 5, 6:
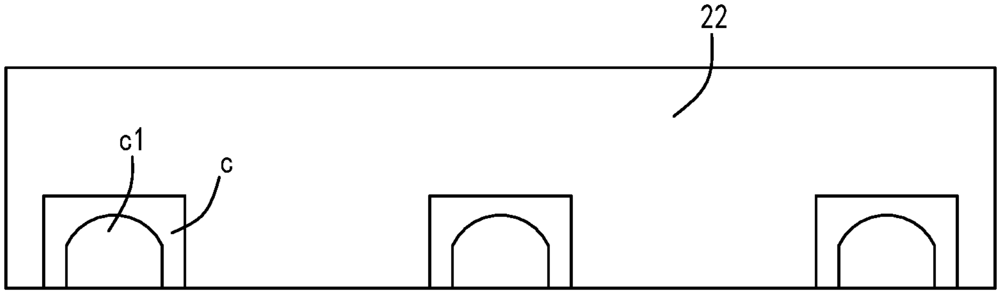
Figures 3, 4, 5, 6, 7:
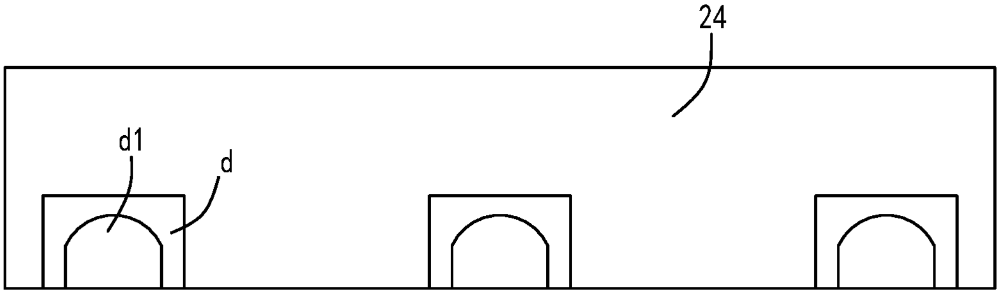
Figures 3, 4, 5, 6, 7, 8:
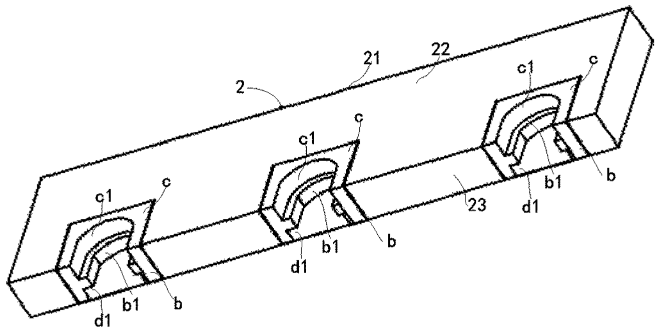
Figures 1, 4:
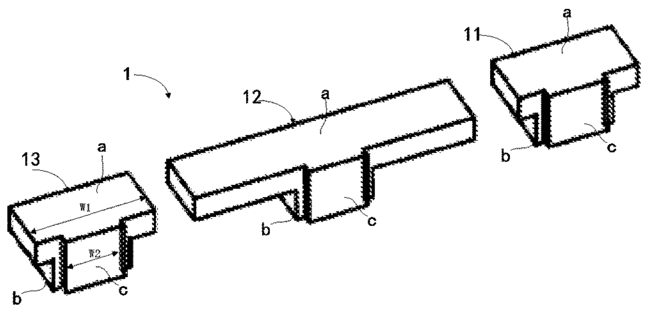
Figures 2, 4:
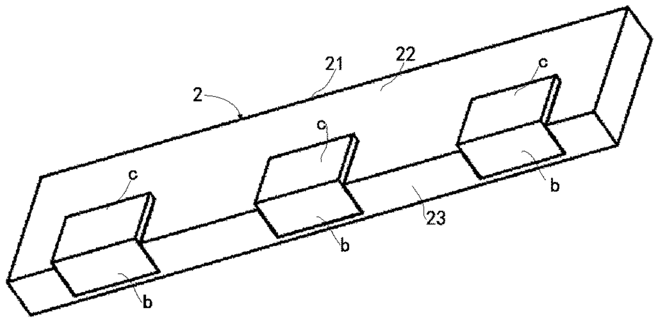
Figures 3, 4:
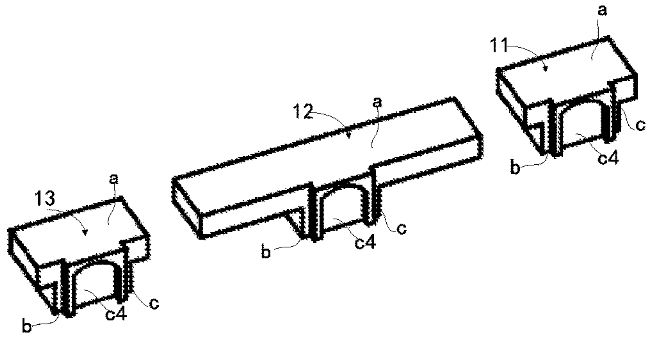
Figure 4:
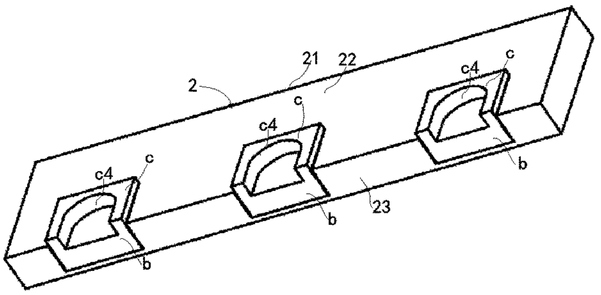
Figures 1, 5:
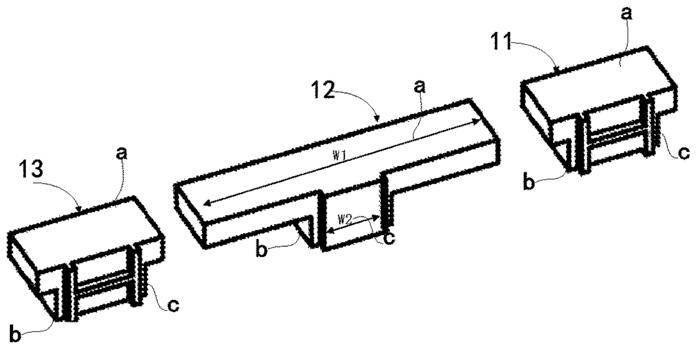
Figures 2, 5:
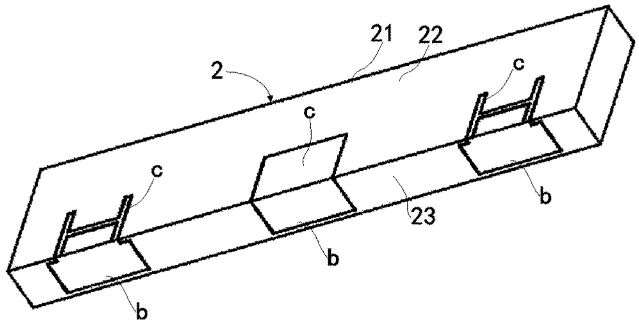
Figures 3, 5:
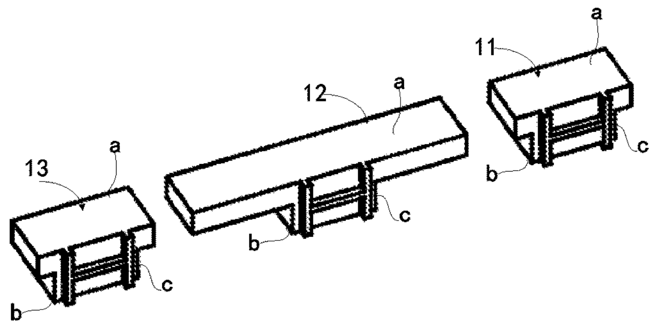
Figures 4, 5:
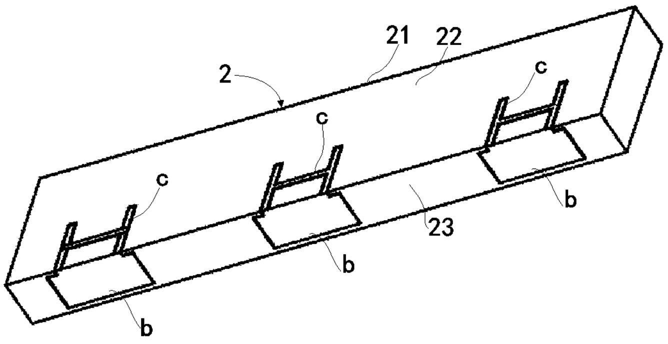
Figure 5:
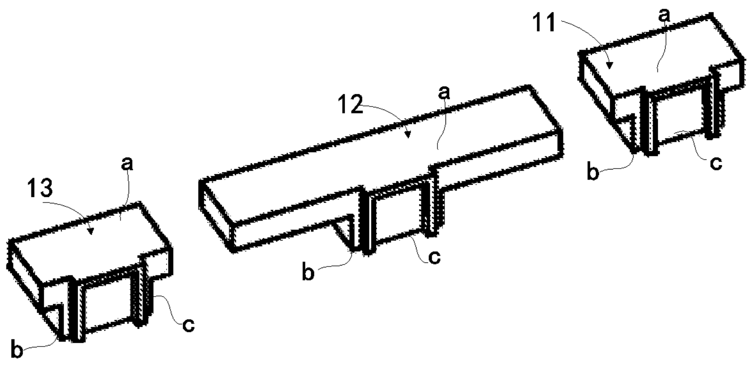
Figures 5, 6:
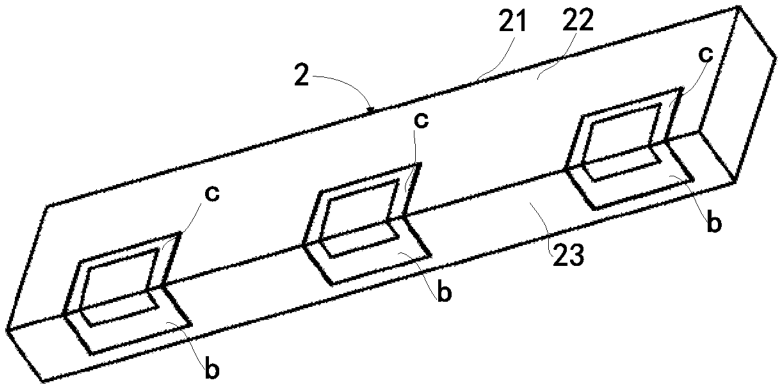
Figures 1, 6:
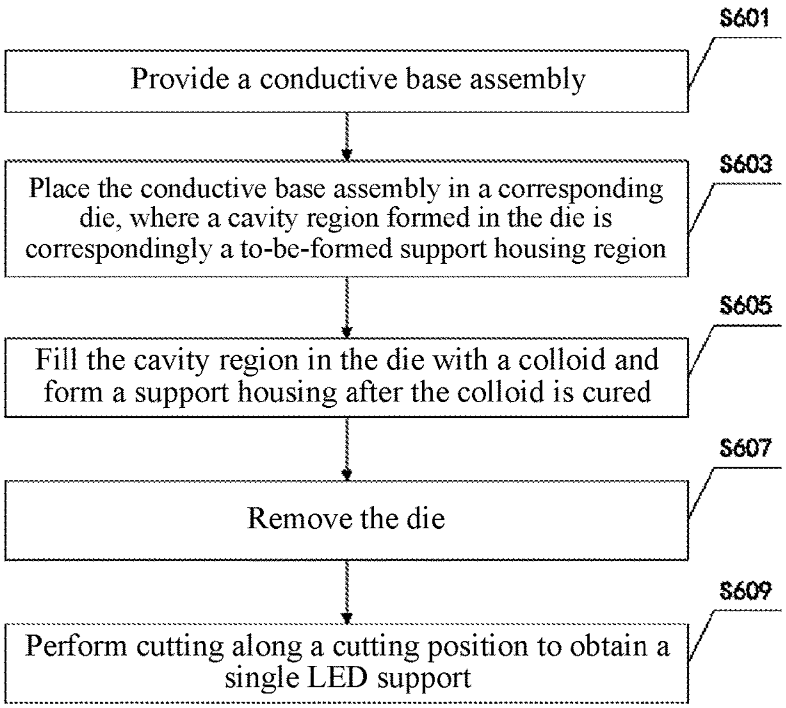
Figures 2, 6:
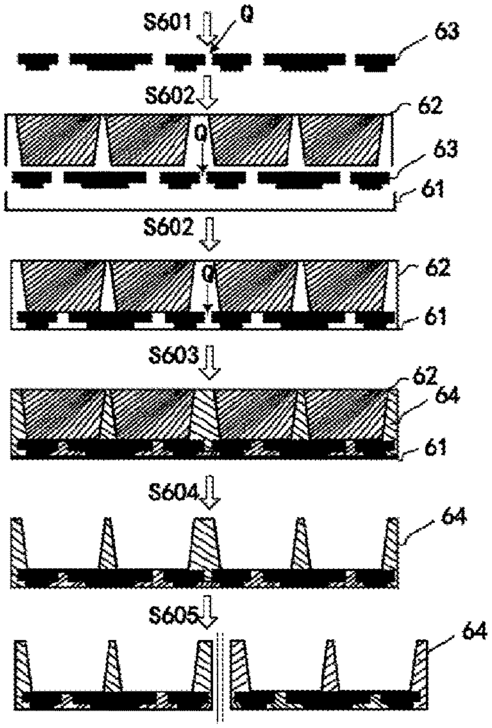
Figures 3, 6:
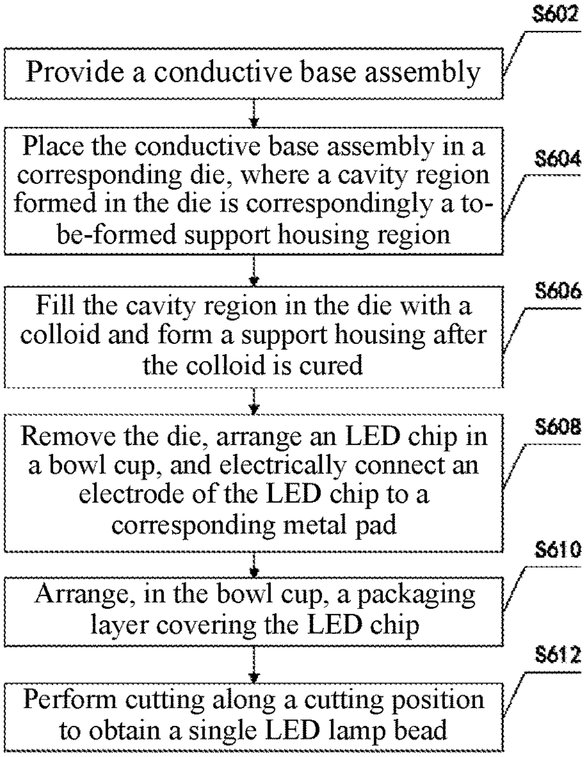
Figures 1, 7:
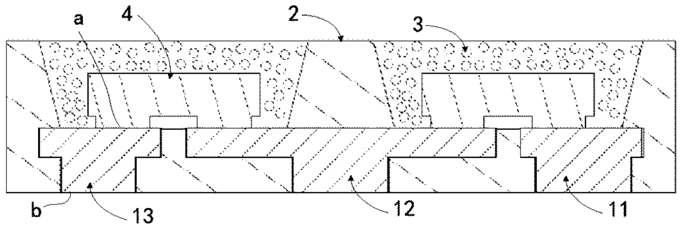
Figures 2, 7:
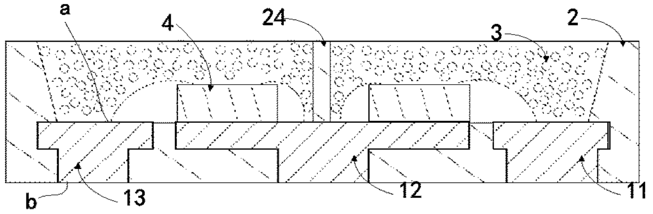
Figures 3, 7:
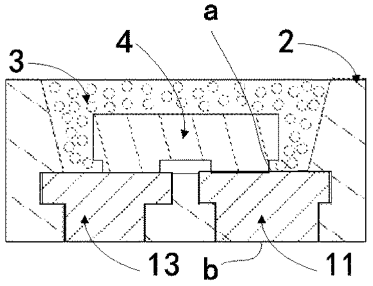
Figures 4, 7:
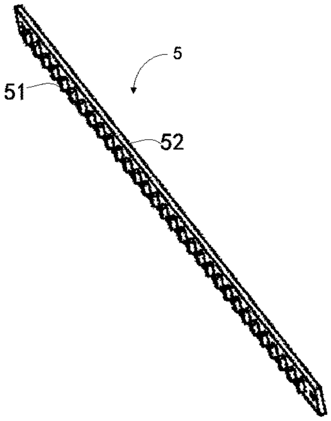
Figures 5, 7:
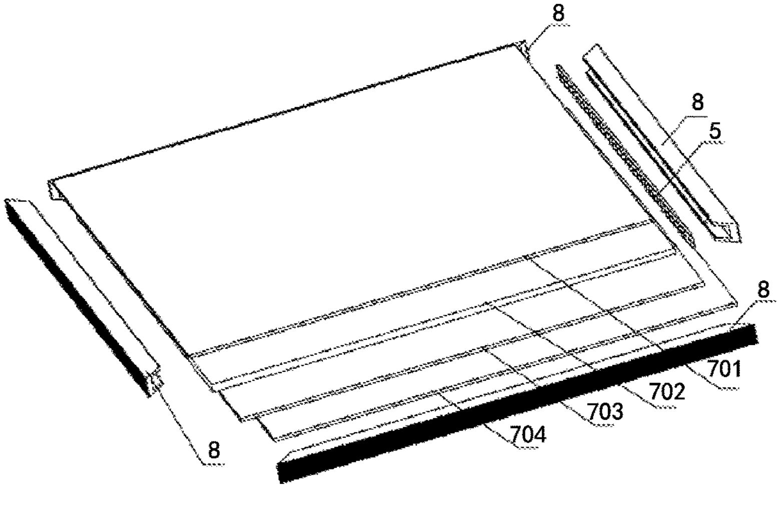

Please refer to FIG. 7-1. FIG. 7-1 is a transverse cross-sectional view of an LED lamp bead manufactured using the LED support in the above examples. In can be learned from the figure that gaps among the first metal pad 11, the second metal pad 12, and the third metal pad 13 are filled with the colloid for forming the support housing, two isolated bowl cups are formed on the first metal pad 11, the second metal pad 12, and the third metal pad 13, and an LED chip 4 is arranged in each of the bowl cups. The LED chip is a flip LED chip. Each flip LED chip spans two adjacent metal pads. The bowl cup is filled with a packaging layer 3.

Please refer to FIG. 7-2. FIG. 7-2 is a transverse cross-sectional view of another LED lamp bead manufactured using the LED support in the above examples. A difference between the LED lamp bead in FIG. 7-2 and the LED lamp bead shown in FIG. 7-1 is that the LED chips 4 arranged in the bowl cups are face-up LED chips, and the two face-up LED chips are both arranged on the upper surface of the second metal pad 12. Certainly, the two face-up LED chips may be respectively arranged on the upper surfaces of the first metal pad 11 and the third metal pad 13, or one of the face-up LED chips may be arranged on the upper surface of the first metal pad 11, and the other may be arranged on the upper surface of the second metal pad 12, or one of the face-up LED chips may be arranged on the upper surface of the third metal pad 13, and the other may be arranged on the upper surface of the second metal pad 12.

As shown in FIG. 7-3, a difference between the LED lamp bead shown in the figure and the LED lamp bead shown in FIG. 7-1 is that the second metal pad 12 is omitted. Certainly, it should be understood that when more than three LED chips connected in series are required, a fourth metal pad and a fifth metal pad may be added based on FIG. 7-1. This may be specifically flexibly selected as required. However, it should be understood that these setting concepts are all equivalent alternative settings made based on the structure provided in this embodiment and fall within the scope of this embodiment.

The LED lamp bead shown in the examples above is composed of the conductive base and the support housing covering the conductive base, which has a structure much simpler and less costly than existing LEDs.

The metal pad can realize both bearing of the LED chip and electrical connection to the LED chip and can serve as a solder pad to realize external electrical connection, which has a high integration level and a simple structure.

Since the LED chip is directly placed on the upper surfaces of the metal pads, and the lower surfaces and the first side surfaces of the metal pads are exposed, heat generated by the LED chip during operation can be directly transferred to the metal pads and is quickly dissipated outward through the metal pads, which improves the performance of the LED lamp bead.

Since the lower surfaces and the first side surfaces of the metal pads are exposed, which may be used as solder pads used for external electrical connection, in a side emitting application scenario, the first side surfaces may be soldered to the exterior, or both the first side surfaces and the lower surfaces may be soldered. In a front emitting application scenario, the lower surfaces may be soldered, or both the lower surfaces and the first side surfaces may be soldered. In addition, the arrangement of the first notches and the second notches can further improve the soldering reliability and convenience. Therefore, various application scenarios are feasible, and soldering is convenient. Soldering may be further performed on two or three of the surfaces as required, which can improve the soldering firmness and improve the reliability of a product.

Optionally, in some examples of this embodiment, only the upper surfaces, the lower surfaces, and the first side surfaces of the metal pads may be arranged to be exposed from an enclosure, and the other surfaces are covered by the support housing, thereby improving the reliability of the bonding between the conductive metal pads and the enclosure.

In an application scenario of this embodiment, the metal pads may be but are not limited to copper substrates. The copper substrate has advantages such as low cost, easy processing, and desirable electrical and thermal conductivity.

Optionally, in some other application examples of this embodiment, a reflective layer may be further arranged at least in the exposed region of the upper surfaces of the metal pads to enhance the light emission efficiency, thereby improving the efficiency of an LED lamp bead. In this embodiment, the reflective layer may be but is not limited to a silver layer. The silver layer may be formed on the copper substrate through electroplating, chemical silvering, or the like, but the present invention is not limited thereto.

It should be understood that an overall shape of the LED support in this embodiment may be elongated, square, hexagonal, or the like. The overall formation of the LED support is not limited in this embodiment.

It should be understood that the metal pads in this embodiment may adopt any type of metal plates which can achieve a reliable conductive connection and have support strength satisfying a demand for an LED support. Since the metal plates have desirable heat dissipation performance, the heat dissipation performance of the LED support can be improved. Certainly, the metal plates may be replaced with other conductive plates made of other materials that can satisfy the demand. In this embodiment, specific shapes and sizes of the metal pads may be flexibly set according to an application requirement, which are not limited in this embodiment.

A material of the colloid forming the support housing in this embodiment may be flexibly selected as required. For example, thermosetting glue or hot pressing glue may be used, or white glue with more desirable reflection performance may be used, but the present invention is not limited thereto. For example, in an example, the material of the colloid may be but is not limited to epoxy or resin materials (such as epoxy glue, silica gel, or resin).

This embodiment further provides a light-emitting unit module. The light-emitting unit module may be applied to various lighting scenarios and/or display scenarios, but the present invention is not limited thereto. The light-emitting unit module includes a substrate and a plurality of LED lamp beads described above. The LED lamp beads are electrically connected to the substrate. The LED lamp beads in this embodiment may be front emitting LED lamp beads or side emitting LED lamp beads. An exemplary light-emitting unit module is shown in FIG. 7-4. The light-emitting unit module 5 shown in the figure includes a substrate 52 and a plurality of side emitting LED lamp beads 51 described above arranged on the substrate 52.

This embodiment further provides a display device including the light-emitting unit module described above. The display device may be applied to various displays, mobile phones, PCs, and advertising devices, but the present invention is not limited thereto. An exemplary display device is shown in FIG. 7-5. The display device includes an outer frame 8, a diaphragm 701 assembled in the outer frame 8, a light guide plate 702, a reflective sheet 703, a metal backboard 704, and a light-emitting unit module 5 arranged corresponding to the diaphragm 701, the light guide plate 702, the reflective sheet 703, and the metal backboard 704.

It should be understood that the display device shown in FIG. 7-5 is merely an example. A specific structure of the display device may be flexibly arranged, and details are not repeatedly described herein.

The above content is a further detailed description of the embodiments of the present invention in combination with specific implementations, but it cannot be concluded that the specific implementations of the present invention are limited to these descriptions. Various simple derivations or replacements may be further made by a person of ordinary skill in the art without departing from the spirit of the present invention, which should be considered as falling within the protection scope of the present invention.

What is claimed is:

1. A conductive base of an LED support, the conductive base comprising at least two metal pads insulated and isolated from each other, wherein the metal pads are bonded to a colloid configured to form a support housing to form the LED support, upper surfaces of the metal pads are located at a bottom of a bowl cup defined by the support housing, the bowl cup is configured for an LED chip to be placed, at least parts of the upper surfaces of the metal pads are exposed, and the upper surface of at least one of the metal pads is configured to bear the LED chip, and an exposed region of the upper surface of each of the metal pads is configured to be electrically connected to an electrode of a corresponding LED chip;

a region of the upper surface of the metal pads bonded to the support housing is provided with a rough surface having a concave-convex structure for enhancing a bonding force with the support housing, or a bonding hole allowing the colloid for forming the support housing to flow in; and at least parts of lower surfaces of the metal pads are exposed from the support housing, the lower surfaces are surfaces opposite to the upper surfaces, a first side surface of at least one of the metal pads located between the upper surface and the lower surface is exposed from the support housing, a first notch is arranged in regions of the lower surfaces exposed from the support housing, and a region of the first side surface exposed from the support housing is formed as a set soldering shape.

2. The conductive base of an LED support according to claim 1, wherein the set soldering shape comprises any of the following:

a second notch formed on the first side surface;

a protrusion formed on the first side surface protruding from the support housing; and a non-rectangular shape formed on the first side surface and flush with the support housing.

3. The conductive base of an LED support according to claim 2, wherein at least a part of a second side surface of at least one of the metal pads located between the upper surface and the lower surface is exposed from the support housing, and the first side surface and the second side surface are two opposite surfaces.

4. The conductive base of an LED support according to claim 3, wherein the set soldering shape comprises the second notch formed on the first side surface, and the first notch is in communication with the second notch.

5. The conductive base of an LED support according to claim 3, wherein the set soldering shape comprises the second notch formed on the first side surface, and a flux layer configured to enhance a soldering ability is arranged on an inner wall of at least one of the first notch and the second notch.

6. The conductive base of an LED support according to claim 2, wherein the set soldering shape comprises the protrusion formed on the first side surface, and a fourth notch configured to accommodate a solder is arranged on the protrusion.

7. The conductive base of an LED support according to claim 2, wherein the conductive base comprises three metal pads arranged in sequence, and the exposed regions of the upper surface of the metal pad arranged in middle are electrically connected to corresponding electrodes of two LED chips.

8. The conductive base of an LED support according to claim 1, wherein a second side surface of at least one of the metal pads located between the upper surface and the lower surface is located inside the support housing, and the first side surface and the second side surface are two opposite surfaces.

9. The conductive base of an LED support according to claim 1, wherein the bonding hole is in communication with the first notch.

10. The conductive base of an LED support according to claim 1, wherein an end of the bonding hole close to the upper surface is an upper end, an end close to the lower surface is a lower end, and a diameter of the upper end of the bonding hole is greater than a diameter of the lower end of the bonding hole.

11. The conductive base of an LED support according to claim 10, wherein a maximum transverse width W3 of the second notch on the metal pad arranged in the middle is greater than a maximum transverse width W3 of the second notch on each of the remaining two metal pads.

12. The conductive base of an LED support according to claim 1, wherein a maximum transverse width W1 of an upper end of at least one of the metal pads close to the upper surface is greater than or equal to a maximum transverse width W2 of the region of the first side surface of the metal pad exposed from the support housing;

and a maximum transverse width W4 of a region of the lower surface of at least one of the metal pads exposed from the support housing is greater than or equal to the maximum transverse width W2 of the region of the first side surface of the metal pad exposed from the support housing.

13. The conductive base of an LED support according to claim 1, wherein a part of an upper end of the metal pad is embedded into the support housing; and a bulge extending outward is arranged on at least one of the metal pads between the upper surface and the lower surface, and at least a part of the bulge is embedded into the support housing.

14. The conductive base of an LED support according to claim 1, wherein the metal pad is a copper substrate, and a reflective layer is arranged at least in the exposed region of the upper surface.

15. An LED support, comprising:

a conductive base comprising at least two metal pads insulated and isolated from each other; and a colloid bonded to the conductive base to form a support housing;

wherein the metal pads are bonded to the colloid to form the LED support, the support housing defines a bowl cup, the upper surfaces of the metal pads are located at a bottom of the bowl cup, the bowl cup is configured for placing an LED chip;

the conductive base comprises three metal pads arranged in sequence, the support housing further comprises an isolation wall arranged on the upper surface of the metal pad arranged in the middle, so as to form two bowl cups isolated from each other on the upper surfaces of the three metal pads;

at least a part of the upper surfaces of the metal pads is exposed, and the upper surface of at least one of the metal pads is configured to bear the LED chip, and the exposed regions of the upper surfaces of the metal pads are configured to be electrically connected to the electrodes of the corresponding LED chips;

at least parts of the lower surfaces of the metal pads are exposed from the support housing, the lower surfaces are surfaces opposite to the upper surfaces, and at least one of the metal pads has a first side surface located between the upper surface and the lower surface exposed from the support housing; and a region of the lower surfaces exposed from the support housing is provided with a first notch. and a region of the first side surface exposed from the support housing forms a set soldering shape.

16. An LED lamp bead, comprising the LED support according to claim 15, an LED chip arranged in the bowl cup, and a packaging layer arranged in the bowl cup and covering the LED chip, wherein the electrodes of the LED chip are electrically connected to the exposed regions of the upper surfaces of the corresponding metal pads.

17. The LED lamp bead according to claim 16, wherein the LED lamp bead is a side emitting LED lamp bead, and the first side surface is coplanar with the support housing; or the LED lamp bead is a front emitting LED lamp bead, and the lower surface is coplanar with the support housing.

18. A light-emitting unit module, comprising a substrate and a plurality of LED lamp beads according to claim 15, wherein the plurality of LED lamp beads are electrically connected to the substrate.

19. A manufacturing method of an LED support, comprising:

providing a conductive base assembly, wherein the conductive base assembly comprises at least two sets of conductive bases, each set of conductive bases correspondingly forms one LED support, each set of conductive bases comprises at least two metal pads insulated and isolated from each other, and a cutting position is arranged between adjacent sets of conductive bases;

placing the conductive base assembly in a corresponding die, wherein a cavity region formed in the die is correspondingly a to-be-formed support housing region;

positioning the metal pads in the cavity region so that the upper surfaces of the metal pads are located at the bottom of a bowl cup formed by the support housing, and at least partial regions of the upper surfaces and lower surfaces of the metal pads are exposed from the support housing after molding;

filling the cavity region in the die with a colloid, and forming a support housing after the colloid is cured, so that the support housing defines a bowl cup for placing an LED chip; and removing the die and performing cutting along the cutting position to obtain a single LED support, wherein the exposed region of the lower surface of the metal pad is provided with a first notch, and the exposed region of the first side surface between the upper surface and the lower surface of the metal pad forms a set soldering shape.

20. A manufacturing method of an LED lamp bead, comprising:

providing a conductive base assembly, wherein the conductive base assembly comprises at least two sets of conductive bases, each set of conductive bases correspondingly forms one LED support, each set of conductive bases comprises at least two metal pads insulated and isolated from each other, and a cutting position is arranged between adjacent sets of conductive bases;

placing the conductive base assembly in a corresponding die, and causing regions of the metal pads that need to be exposed to snugly contact the die, so as to define partial upper surfaces, lower surfaces, and first side surfaces between the upper surfaces and the lower surfaces of the metal pads to be exposed after molding;

forming a cavity region corresponding to the support housing in the die, and filling the cavity region with a colloid, forming a support housing after the colloid is cured, so that the support housing defines a bowl cup for placing an LED chip, and the upper surfaces of the metal pads are located at the bottom of the bowl cup and are at least partially exposed, wherein the upper surface of at least one of the metal pads is configured to bear the LED chip;

wherein, through the corresponding structure of the die, the regions of the lower surfaces of the metal pads exposed from the support housing are formed with first notches, and the regions of the first side surfaces exposed from the support housing are formed with a set soldering shape;

removing the die, arranging an LED chip in the bowl cup, and electrically connecting the electrodes of the LED chip to the exposed regions of the upper surfaces of the corresponding metal pads;

arranging a packaging layer in the bowl cup to cover the LED chip; and performing cutting along the cutting position to obtain a single LED lamp bead.

* * * * *